(12) United States Patent
Hamada et al.

(10) Patent No.: US 12,080,705 B2
(45) Date of Patent: Sep. 3, 2024

(54) IGBT WITH ANTI-PARALLELLY CONNECTED FWD ON A COMMON SUBSTRATE

(71) Applicant: Mitsubishi Electric Corporation, Tokyo (JP)

(72) Inventors: Kenji Hamada, Tokyo (JP); Kazuya Konishi, Tokyo (JP); Kotaro Kawahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 409 days.

(21) Appl. No.: 17/609,783

(22) PCT Filed: Jul. 12, 2019

(86) PCT No.: PCT/JP2019/027700
§ 371 (c)(1),
(2) Date: Nov. 9, 2021

(87) PCT Pub. No.: WO2021/009801
PCT Pub. Date: Jan. 21, 2021

(65) Prior Publication Data
US 2022/0223583 A1    Jul. 14, 2022

(51) Int. Cl.
*H01L 27/06* (2006.01)
*H01L 29/06* (2006.01)
(Continued)

(52) U.S. Cl.
CPC ...... *H01L 27/0629* (2013.01); *H01L 29/0696* (2013.01); *H01L 29/66333* (2013.01); *H01L 29/7394* (2013.01)

(58) Field of Classification Search
CPC .......... H01L 29/66325–66348; H01L 29/7393–7398; H01L 2924/13055; H01L 29/083–0839
See application file for complete search history.

(56) References Cited

U.S. PATENT DOCUMENTS 7,400,017 B2    7/2008  Aono et al.
9,640,610 B2    5/2017  Hamada et al.
(Continued)

FOREIGN PATENT DOCUMENTS

JP    2008-192737 A    8/2008
JP    4791704 B2    10/2011
(Continued)

OTHER PUBLICATIONS

International Search Report and Written Opinion mailed on Oct. 1, 2019, received for PCT Application PCT/JP2019/027700, Filed on Jul. 12, 2019, 9 pages including English Translation.

*Primary Examiner* — Wasiul Haider
(74) *Attorney, Agent, or Firm* — XSENSUS LLP

(57) ABSTRACT

In order to improve energization capacity, minority carrier injection efficiency is increased. In a semiconductor device, an IGBT includes a first drift layer, a collector region, a base region, an emitter region, an insulating film, a gate electrode, and a first high carrier lifetime region formed at a position closer to the collector region than the base region and having a longer carrier lifetime than the first drift layer. An FWD includes a second drift layer, an anode region, and a second high carrier lifetime region formed at a position closer to the anode region than a lower surface of the second drift layer and having a longer carrier lifetime than the second drift layer.

13 Claims, 12 Drawing Sheets

(51) Int. Cl.
*H01L 29/66* (2006.01)
*H01L 29/739* (2006.01)

(56) References Cited

U.S. PATENT DOCUMENTS

| | | |
|---|---|---|
| 2013/0260515 A1 | 10/2013 | Mizushima |
| 2016/0276446 A1* | 9/2016 | Wakimoto ............ H01L 21/265 |
| 2019/0067462 A1* | 2/2019 | Tamura ............... H01L 27/0727 |

FOREIGN PATENT DOCUMENTS

| | | |
|---|---|---|
| JP | 2012-33618 A | 2/2012 |
| JP | 2013-48247 A | 3/2013 |
| JP | 2013-197306 A | 9/2013 |
| JP | 6169249 B2 | 7/2017 |

* cited by examiner

F I G. 1
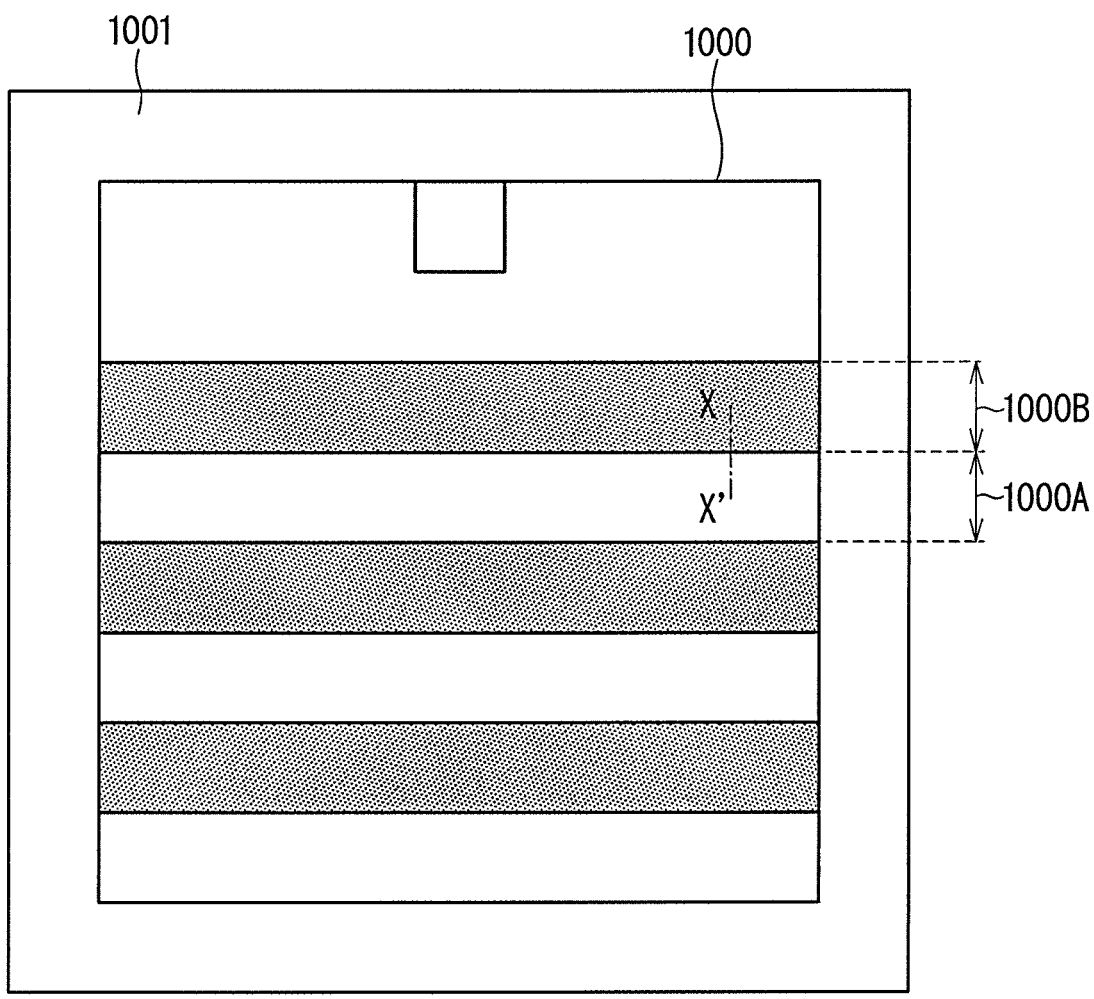

FWD REGION | IGBT REGION

FWD REGION | IGBT REGION

IGBT WITH ANTI-PARALLELLY CONNECTED FWD ON A COMMON SUBSTRATE

CROSS-REFERENCE TO RELATED APPLICATION

The present application is based on PCT filing PCT/JP2019/027700, filed Jul. 12, 2019, the entire contents of which are incorporated herein by reference.

TECHNICAL FIELD

The technique disclosed in the specification of the present application relates to a semiconductor device and a method for manufacturing the semiconductor device.

BACKGROUND ART

Conventionally, there has been known a power semiconductor device in which an insulated gate bipolar transistor, that is, IGBT using silicon (Si) as a semiconductor material and a free-wheeling diode, that is, FWD connected in antiparallel with the IGBT are formed in the same semiconductor substrate.

For example, Patent Document 1 discloses a semiconductor device in which an IGBT and an FWD are formed on the same semiconductor substrate, a common electrode functioning as an emitter electrode of the IGBT and an anode electrode of the FWD is formed on an upper surface side of the semiconductor substrate, and a common electrode functioning as a collector electrode of the IGBT and a cathode electrode of the FWD is formed on a lower surface side of the semiconductor substrate.

Such a semiconductor device is referred to as a reverse conducting IGBT, that is, an RC-IGBT.

Since a semiconductor substrate using Si generally has a high carrier lifetime (that is, since the carrier lifetime is long,), recovery characteristics of the FWD often become a problem even in the RC-IGBT.

When a reflux operation (that is, forward direction energization) state of the FWD is switched to a reverse recovery (recovery) state of the FWD, that is, in a transition period from a current conduction state to the FWD to a high voltage holding state, a reverse recovery (recovery) current continues to flow until minority carriers accumulated in the semiconductor substrate disappear due to recombination. Therefore, the voltage holding state and the current conduction state simultaneously appear inside the FWD, and as a result, recovery loss increases (recovery characteristics deteriorate).

As a method for improving the recovery characteristics of the FWD, a carrier lifetime control method is used in which a low carrier lifetime layer (layer having a short carrier lifetime) is formed by irradiating the entire semiconductor substrate, that is, an entire region of an IGBT region and an FWD region with radiation such as light ions or electron beams as a carrier lifetime killer and introducing crystal defects into the semiconductor substrate.

By this method, the crystal defects introduced into the semiconductor substrate serve as recombination centers, and the recombination of minority carriers is promoted at the time of recovery of the FWD. Therefore, recovery characteristics can be improved.

In addition, for example, Patent Document 2 proposes a method of limiting a region where a low carrier lifetime layer is formed to only an FWD region (that is, a carrier lifetime killer is not introduced into an IGBT region). According to the method, recovery characteristics of an FWD can be improved without impairing energization capacity of an IGBT.

In addition, for example, Patent Document 3 proposes a method of providing a low carrier lifetime layer on a collector side of an IGBT region and an anode side of an FWD region. According to the method, it is possible to achieve soft recovery of an FWD while reducing turn-off loss of an IGBT.

PRIOR ART DOCUMENTS

Patent Documents

Patent Document 1: Japanese Patent No. 4791704
Patent Document 2: Japanese Patent Application Laid-Open No. 2008-192737
Patent Document 3: Japanese Patent Application Laid-Open No. 2013-197306

SUMMARY

Problem to be Solved by the Invention

In recent years, SiC-IGBTs have been proposed in which silicon carbide (SiC), being a wide bandgap semiconductor material is applied to IGBTs. The SiC-IGBT is expected to be able to achieve a low-loss device in an ultra-high withstand voltage region (for example, 10 kV or more), which cannot be achieved by the Si-IGBT (see, for example, Japanese Patent Application Laid-Open No. 2012-033618).

However, examples of a problem specific to a SiC semiconductor substrate include the fact that a carrier lifetime of the semiconductor substrate itself is remarkably short.

Therefore, in an RC-IGBT using the SiC semiconductor substrate, that is, a SiC-RC-IGBT, a conventional method of forming a low carrier lifetime layer in a partial region by irradiating the partial region with a radiation such as light ions or an electron beam, which is a method of improving characteristics of an RC-IGBT using a Si semiconductor substrate, cannot be applied.

In general, the Si semiconductor substrate has a long carrier lifetime and high minority carrier transport efficiency. Therefore, in the Si-RC-IGBT, minority carrier injection efficiency is lowered, and all of energization capacity, turn-off characteristics, and recovery characteristics are secured.

Taking the Si-IGBT as an example, it is common to "shorten" a carrier lifetime on a collector side by lowering minority carrier injection efficiency by performing electron beam irradiation from the collector side or lowering the impurity concentration of a collector region itself.

On the other hand, in the SiC semiconductor substrate having a carrier lifetime shorter than that of the Si semiconductor substrate, since minority carrier transport efficiency is low, it is necessary to increase minority carrier injection efficiency in order to improve energization capacity.

Taking the SiC-IGBT as an example, it is required to "increase" a carrier lifetime on a collector side by some method.

That is, in order to improve the characteristics of the SiC-RC-IGBT, a technical idea different from the characteristic improvement technique of the Si-RC-IGBT is required.

The technique disclosed in the specification of the present application has been made in view of the above-described problems, and an object thereof is to provide a technique for improving minority carrier injection efficiency in order to improve energization capacity.

Means to Solve the Problem

A first aspect of a technique disclosed in the specification of the present application is a semiconductor device including: an IGBT; and an FWD. The IGBT and the FWD are formed on an identical SiC semiconductor substrate, and the IGBT and the FWD are connected in antiparallel. The IGBT includes: a first drift layer of a first conductivity type, a collector region of a second conductivity type on a lower surface of the first drift layer, a base region of a second conductivity type selectively formed in a surface layer of the first drift layer, an emitter region of a first conductivity type selectively formed in a surface layer of the base region, an insulating film in contact with the base region sandwiched between the emitter region and the first drift layer, a gate electrode in contact with the insulating film, and a first high carrier lifetime region formed at a position closer to the collector region than the base region in the first drift layer and having a longer carrier lifetime than the first drift layer. The FWD includes: a second drift layer of a first conductivity type, a cathode region of a first conductivity type on a lower surface of the second drift layer, an anode region of a second conductivity type selectively formed in a surface layer of the second drift layer, and a second high carrier lifetime region formed at a position closer to the anode region than the cathode region in the second drift layer and having a longer carrier lifetime than the second drift layer. The semiconductor device further includes: an emitter electrode connected to the emitter region and the anode region, and a collector electrode connected to the collector region and the cathode region.

A second aspect of a technique disclosed in the specification of the present application is a method for manufacturing a semiconductor device in which an IGBT and an FWD are formed on an identical SiC semiconductor substrate, and the IGBT and the FWD are connected in antiparallel, the method including: preparing a drift layer of a first conductivity type; selectively forming a base region of a second conductivity type in a surface layer in a region to be the IGBT of the drift layer, and selectively forming an anode region of a second conductivity type in a surface layer in a region to be the FWD of the drift layer; selectively forming an emitter region of a first conductivity type in a surface layer of the base region; forming a collector region of a second conductivity type on a lower surface in a region to be the IGBT of the drift layer; forming a cathode region of a first conductivity type on a lower surface in a region to be the FWD of the drift layer; forming a first high carrier lifetime region having a longer carrier lifetime than the drift layer at a position closer to the collector region than the base region in a region to be the IGBT of the drift layer; forming a second high carrier lifetime region having a longer carrier lifetime than the drift layer at a position closer to the anode region than the cathode region in a region to be the FWD of the drift layer; forming an insulating film in contact with the base region sandwiched between the emitter region and the drift layer; forming a gate electrode in contact with the insulating film; forming an emitter electrode connected to the emitter region and the anode region; and forming a collector electrode connected to the collector region and the cathode region.

Effects of the Invention

A first aspect of a technique disclosed in the specification of the present application is a semiconductor device including: an IGBT; and an FWD. The IGBT and the FWD are formed on an identical SiC semiconductor substrate, and the IGBT and the FWD are connected in antiparallel. The IGBT includes: a first drift layer of a first conductivity type, a collector region of a second conductivity type on a lower surface of the first drift layer, a base region of a second conductivity type selectively formed in a surface layer of the first drift layer, an emitter region of a first conductivity type selectively formed in a surface layer of the base region, an insulating film in contact with the base region sandwiched between the emitter region and the first drift layer, a gate electrode in contact with the insulating film, and a first high carrier lifetime region formed at a position closer to the collector region than the base region in the first drift layer and having a longer carrier lifetime than the first drift layer. The FWD includes: a second drift layer of a first conductivity type, a cathode region of a first conductivity type on a lower surface of the second drift layer, an anode region of a second conductivity type selectively formed in a surface layer of the second drift layer, and a second high carrier lifetime region formed at a position closer to the anode region than the cathode region in the second drift layer and having a longer carrier lifetime than the second drift layer. The semiconductor device further includes: an emitter electrode connected to the emitter region and the anode region, and a collector electrode connected to the collector region and the cathode region. According to this configuration, it is possible to improve energization capacity by increasing minority carrier injection efficiency, and to achieve reduction in turn-off loss and reduction in recovery loss.

A second aspect of a technique disclosed in the specification of the present application is a method for manufacturing a semiconductor device in which an IGBT and an FWD are formed on an identical SiC semiconductor substrate, and the IGBT and the FWD are connected in antiparallel, the method including: preparing a drift layer of a first conductivity type; selectively forming a base region of a second conductivity type in a surface layer in a region to be the IGBT of the drift layer, and selectively forming an anode region of a second conductivity type in a surface layer in a region to be the FWD of the drift layer; selectively forming an emitter region of a first conductivity type in a surface layer of the base region; forming a collector region of a second conductivity type on a lower surface in a region to be the IGBT of the drift layer; forming a cathode region of a first conductivity type on a lower surface in a region to be the FWD of the drift layer; forming a first high carrier lifetime region having a longer carrier lifetime than the drift layer at a position closer to the collector region than the base region in a region to be the IGBT of the drift layer; forming a second high carrier lifetime region having a longer carrier lifetime than the drift layer at a position closer to the anode region than the cathode region in a region to be the FWD of the drift layer; forming an insulating film in contact with the base region sandwiched between the emitter region and the drift layer; forming a gate electrode in contact with the insulating film; forming an emitter electrode connected to the emitter region and the anode region; and forming a collector electrode connected to the collector region and the cathode region. According to this configuration, it is possible to improve energization capacity by increasing minority carrier injection efficiency, and to achieve reduction in turn-off loss and reduction in recovery loss.

In addition, the objects, features, aspects, and advantages related to the technology disclosed in the specification of the present application will become further apparent from the detailed description and the accompanying drawings shown hereinafter.

BRIEF DESCRIPTION OF DRAWINGS

FIG. 1 is a plan view schematically showing an example of a configuration of a semiconductor device (specifically, a planar gate type SiC-RC-IGBT) according to an embodiment.

DESCRIPTION OF EMBODIMENTS

Figure 2:
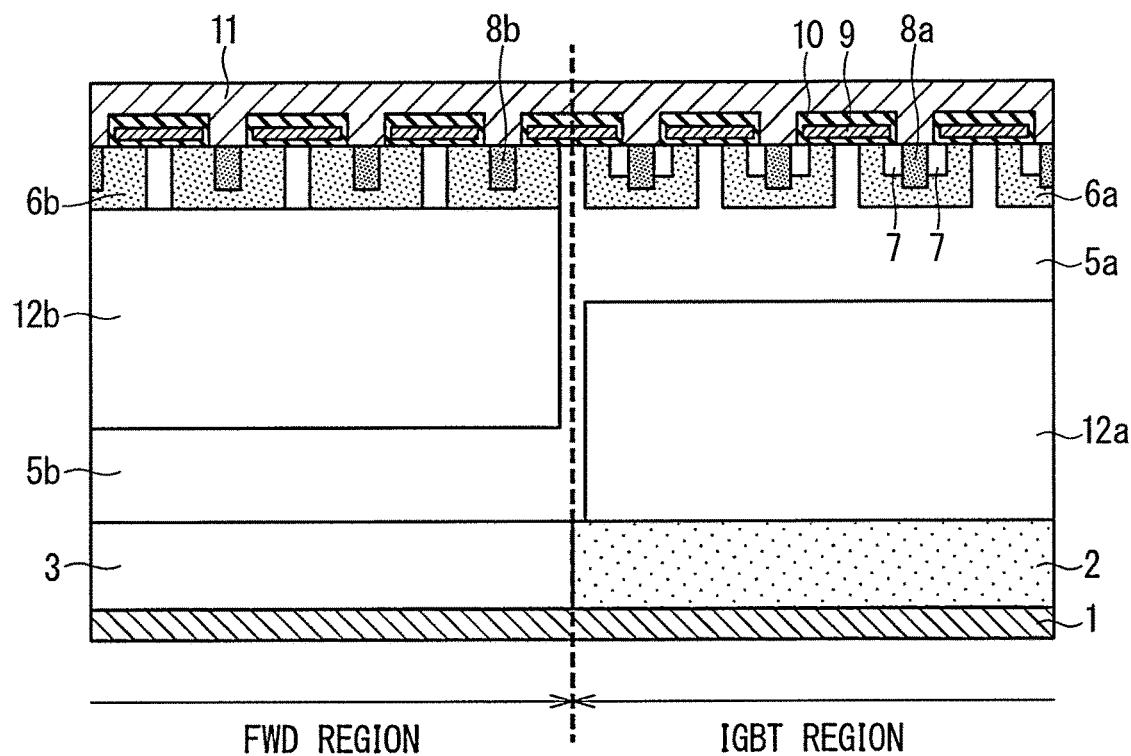
FIG. 2 is a cross-sectional view schematically showing the example of the configuration of the semiconductor device (specifically, the planar gate type SiC-RC-IGBT) according to the embodiment.

Hereinafter, embodiments will be described with reference to the accompanying drawings. In the following embodiments, detailed features and the like are also shown for the description of the technique, but they are merely examples, and not all of them are necessarily essential features for enabling the embodiments to be carried out.

It should be noted that the drawings are schematically shown, and for convenience of description, the configuration may be omitted or the configuration may be simplified in the drawings as appropriate. In addition, the mutual relationship between the sizes and positions of the respective configurations shown in the different drawings is not necessarily described accurately and can be appropriately changed. In addition, in drawings such as plan views other than cross-sectional views, hatching may be added in order to facilitate understanding of the contents of the embodiments.

In addition, in the following description, the same components are denoted by the same reference numerals to be illustrated, and their names and functions are also the same. Therefore, detailed descriptions thereof may be omitted to avoid overlapping.

In addition, in the following description, when description such as "comprising", "including", or "having" a certain component is made, it is not an exclusive expression excluding the presence of other components unless otherwise noted.

In addition, in the following description, ordinal numbers such as "first" or "second" may be used, but these terms are used to facilitate understanding of the contents of the embodiments for convenience, and are not limited to the order or the like that can be generated by these ordinal numbers.

In addition, in the following description, an expression indicating an equal state, for example, "same", "equal", "uniform", or "homogeneous" is assumed to include a case indicating an exactly equal state and a case where a difference occurs within a range in which a tolerance or a similar function can be obtained, unless otherwise noted.

In addition, in the following description, terms that mean a specific position and direction such as "upper", "lower", "left", "right", "side", "bottom", "front", or "back" may be used, but these terms are used to facilitate understanding of the contents of the embodiments for convenience and are not related to the direction at the time of actual implementation.

In addition, in the following description, when it is described as "the upper surface of . . . ", "the lower surface of . . . ", or the like, it is assumed to include a state in which another component is formed on the upper surface of the target component in addition to the upper surface itself of the target component. That is, for example, the description "Second Party provided on the upper surface of First Party" does not preclude the interposition of another component "Third Party" between First Party and Second Party.

In recent years, SiC-IGBTs have been proposed in which silicon carbide (SiC) being a wide bandgap semiconductor material is applied to IGBTs. The SiC-IGBT is expected to be able to achieve a low-loss device in an ultra-high withstand voltage region (for example, 10 kV or more), which cannot be achieved by an Si-IGBT (see, for example, Japanese Patent Application Laid-Open No. 2012-033618).

However, examples of a problem peculiar to a SiC semiconductor include the fact that a carrier lifetime of the semiconductor itself is remarkably short. That is, it is very difficult to obtain a SiC semiconductor substrate having a purity as high as that of a Si semiconductor substrate, and while a carrier lifetime of a Si semiconductor substrate manufactured using a floating zone method (FZ method) is 1 ms or more, a common carrier lifetime of a commercially available SiC semiconductor substrate (including an SiC epitaxial substrate in which an epitaxial growth layer is formed on an upper surface of the SiC semiconductor substrate) is about 1 which is extremely short.

It is considered that this is because a large number of crystal defects such as impurities, intrinsic defects, dislocations, or stacking faults are present in the SiC semiconductor substrate, and thus they serve as recombination centers and carrier lifetime killers (carrier traps).

Therefore, in an RC-IGBT using the SiC semiconductor substrate, that is, a SiC-RC-IGBT, a conventional method of forming a low carrier lifetime layer in a partial region by irradiating the partial region with a radiation such as light ions or an electron beam, which is a method of improving characteristics of an RC-IGBT using a Si semiconductor substrate, cannot be applied.

On the other hand, as a technique for improving the carrier lifetime of the SiC semiconductor itself, for example, Japanese Patent Application Laid-Open No. 2013-048247 discloses a method of implanting ions that do not become dopants into a SiC semiconductor in which a large number of carrier lifetime killers (carrier traps) exist.

In the method, interstitial carbon is introduced by the implanted ions, and the interstitial carbon is diffused into the SiC semiconductor by subsequent annealing. At the same time, combining the interstitial carbon with point defects (carrier traps) in the SiC semiconductor forms a region in which electrically active point defects are reduced.

Furthermore, as an application of the carrier lifetime improvement technique in the SiC semiconductor described above, for example, Japanese Patent No. 6169249 discloses a technique of forming a region (that is, the region where the carrier lifetime is improved) in which a carrier trap is partially reduced, and a SiC-RC-IGBT manufactured using the technique.

That is, forming the region (that is, the region where the carrier lifetime is improved) in which the carrier trap is reduced only in the energization region of the main current of the IGBT allows the energization capacity of the IGBT to be improved without reducing the recombination of minority carriers at the time of recovery of the FWD or impairing the recovery characteristics of the FWD.

As described above, in order to improve the characteristics of the RC-IGBT (that is, to reduce the turn-off loss in the IGBT region or the recovery loss in the FWD region while improving the energization capacity), carrier lifetime control in the thickness direction of the semiconductor substrate is necessary.

That is, simply extending the carrier lifetime or shortening the carrier lifetime uniformly over the entire region in the thickness direction of the semiconductor substrate would extremely deteriorate any one of the energization capacity, the turn-off loss, and the recovery loss. Therefore, by allowing the region having a long carrier lifetime and the region having a short carrier lifetime to coexist, all of them can be secured.

In general, a Si semiconductor substrate has a long carrier lifetime and high minority carrier transport efficiency. Therefore, minority carrier injection efficiency is lowered, and all of energization capacity, turn-off characteristics, and recovery characteristics are secured.

Taking the Si-IGBT as an example, it is common to "shorten" the carrier lifetime on the collector side by lowering the minority carrier injection efficiency by performing electron beam irradiation from the collector side or lowering the impurity concentration of the collector region itself.

On the other hand, in a SiC semiconductor substrate having a carrier lifetime shorter than that of a Si semiconductor substrate, since minority carrier transport efficiency is low, it is necessary to increase minority carrier injection efficiency in order to improve energization capacity.

Taking the SiC-IGBT as an example, it is required to "increase" the carrier lifetime on the collector side.

That is, in order to improve the characteristics of the SiC-RC-IGBT, a technical idea exactly opposite to the characteristic improvement technique of the Si-RC-IGBT is required.

However, in the above Patent Documents, in the IGBT region and the FWD region, a configuration where the minority carrier injection efficiency is high and the minority carrier transport efficiency is low is not achieved, and it is difficult to improve the characteristics of the SiC-RC-IGBT.

First Embodiment

Hereinafter, a semiconductor device and a method for manufacturing the semiconductor device according to the present embodiment will be described.

It should be noted that in the description hereinafter, regarding a conductivity type of an impurity, it is assumed that a first conductivity type is n-type and a second conductivity type is p-type, but the opposite definition may be used.

In addition, with respect to the plane orientation of the SiC crystal, the Si plane is generally defined as an "upper surface" and the C plane is generally defined as a "lower surface", but the opposite definition may be used. In addition, "upper and lower" in the definition is not related to a direction in actual implementation.

<Configuration of Semiconductor Device>

FIG. 1 is a plan view schematically showing an example of a configuration of a semiconductor device (specifically, a planar gate type SiC-RC-IGBT) according to the present embodiment.

As shown in FIG. 1, the SiC-RC-IGBT includes an active region 1000 and a termination region 1001 surrounding the active region 1000.

In addition, in the active region 1000, an IGBT region 1000A in which an IGBT structure is formed and an FWD region 1000B in which an FWD structure is formed are alternately formed.

FIG. 2 is a cross-sectional view schematically showing the example of the configuration of the semiconductor device (specifically, the planar gate type SiC-RC-IGBT) according to the present embodiment. In addition, FIG. 2 corresponds to a cross section taken along line X-X' in FIG. 1.

As shown with an example in FIG. 2, the SiC-RC-IGBT 100 is a SiC-RC-IGBT in which the IGBT region 1000A and the FWD region 1000B are integrally formed in a SiC semiconductor substrate.

It should be noted that FIG. 2 is a cross-sectional view enlarging a boundary between the IGBT region 1000A and the FWD region 1000B in the SiC-RC-IGBT 100, and in an actual semiconductor chip, a plurality of similar configurations are arranged in the active region (see, for example, FIG. 1). Here, for convenience, a configuration whose example is shown in FIG. 2 is referred to as a SiC-RC-IGBT 100.

As shown with an example in FIG. 2, the IGBT region of the SiC-RC-IGBT 100 includes: a first conductivity type (n-type) drift layer 5a, a second conductivity type (p-type) collector region 2 formed on a lower surface of the n-type drift layer 5a, a p-type base region 6a selectively formed in a surface layer of the n-type drift layer 5a, an n-type emitter region 7 selectively formed in a surface layer of the p-type base region 6a, a p-type base contact region 8a formed to reach the inside of the p-type base region 6a from an upper surface of the n-type emitter region 7, an insulating film 10 formed on an upper surface of the p-type base region 6a sandwiched between the n-type emitter region 7 and the n-type drift layer 5a, and a gate electrode 9 formed on an upper surface of the insulating film 10. The gate electrode 9 can form a channel in the surface layer of the p-type base region 6a.

In addition, as shown with an example in FIG. 2, the FWD region of the SiC-RC-IGBT 100 includes: an n-type drift layer 5b, an n-type cathode region 3 formed on the lower surface of the n-type drift layer 5b, a p-type anode region 6b selectively formed in a surface layer of the n-type drift layer 5b, a p-type anode contact region 8b selectively formed on a surface layer of the p-type anode region 6b, an insulating film 10 formed on the upper surface of the n-type drift layer 5b sandwiched between the p-type anode regions 6b, and a gate electrode 9 formed on the upper surface of the insulating film 10.

In addition, the SiC-RC-IGBT 100 includes an emitter electrode 11 connected to the n-type emitter region 7, the p-type base contact region 8a, the p-type anode contact region 8b, and the p-type anode region 6b, and a collector electrode 1 connected to the p-type collector region 2 and the n-type cathode region 3.

In addition, the SiC-RC-IGBT 100 includes a high carrier lifetime region 12a having a carrier lifetime higher (that is, longer) than that of the n-type drift layer 5a in a partial region on the p-type collector region 2 side in the n-type drift layer 5a in the IGBT region.

In addition, the SiC-RC-IGBT 100 includes a high carrier lifetime region 12b having a carrier lifetime higher (that is, longer) than that of the n-type drift layer 5b in a partial region on the p-type anode region 6b side in the n-type drift layer 5b in the FWD region.

The impurity concentration of the n-type drift layer 5a is, for example, $1 \times 10^{13}$ cm$^{-3}$ or more and $1 \times 10^{15}$ cm$^{-3}$ or less. In addition, the thickness (that is, the length in the thickness direction of the semiconductor device) of the n-type drift layer 5a is, for example, within the range of 100 μm or more and 300 μm or less.

In addition, the impurity concentration of the n-type drift layer 5b is, for example, $1 \times 10^{13}$ cm$^{-3}$ or more and $1 \times 10^{15}$ cm$^{-3}$ or less. In addition, the thickness (that is, the length in the thickness direction of the semiconductor device) of the n-type drift layer 5b is, for example, within the range of 100 μm or more and 300 μm or less.

Here, the thickness of the n-type drift layer 5a refers to a distance from the bottom portion of the p-type base region 6a to the upper surface of the p-type collector region 2.

In addition, the thickness of the n-type drift layer 5b refers to a distance from the bottom portion of the p-type anode region 6b to the upper surface of the n-type cathode region 3.

The reason why the thickness of the n-type drift layer 5a and the thickness of the n-type drift layer 5b are each 100 μm or more is that the thicknesses of these layers contribute to the withstand voltage performance of the semiconductor device.

For example, in order to secure a withstand voltage of 13 kV, the impurity concentration of these layers may be, for example, $2 \times 10^{14}$ cm$^{-3}$, and the thicknesses of these layers may be, for example, 100 μm. In addition, in order to secure a withstand voltage of 27 kV, the impurity concentration of these layers may be, for example, $1 \times 10^{14}$ cm$^{-3}$, and the thicknesses of these layers may be, for example, 250 μm.

In addition, for convenience, the n-type drift layer 5a in the IGBT region and the n-type drift layer 5b in the FWD region are separated, but since the IGBT region and the FWD region are formed in the same semiconductor substrate, basically, the n-type drift layer 5a and the n-type drift layer 5b have the same impurity concentration and thickness.

In addition, an n-type field stop layer (that is, FS layer) may be formed on the lower surface of the n-type drift layer 5a and the lower surface of the n-type drift layer 5b.

The FS layer can reliably stop a depletion layer extending in the n-type drift layer 5a and the n-type drift layer 5b when the semiconductor device is turned off.

It should be noted that the impurity concentration of the FS layer is, for example, $1 \times 10^{16}$ cm$^{-3}$ or more and $1 \times 10^{18}$ cm$^{-3}$ or less. In addition, the thickness of the FS layer is, for example, within a range of 0.1 μm or more and 10 μM or less.

In addition, the FS layer needs to function as a layer that reliably stops the depletion layer extending in the n-type drift layer 5a and the n-type drift layer 5b when the semiconductor device is turned off.

For example, in order to secure a withstand voltage of 13 kV, when the impurity concentration of the n-type drift layer 5a and the n-type drift layer 5b is $2 \times 10^{14}$ cm$^{-3}$, and the thickness of the n-type drift layer 5a and the n-type drift layer 5b is 100 μm, the impurity concentration of the FS layer can be, for example, $7 \times 10^{16}$ cm$^{-3}$, and the thickness of the FS layer can be, for example, 2 μm.

That is, the impurity concentration of the FS layer is higher than the impurity concentration of the n-type drift layer 5a and the impurity concentration of the n-type drift layer 5b.

In addition, the impurity concentration of the FS layer may be a "box profile" being constant in the thickness direction of the semiconductor device, or may be an "inclined (or gradient) profile" having a gradient in the thickness direction of the semiconductor device.

In addition, when the impurity concentration of the n-type drift layer 5a and the impurity concentration of the n-type drift layer 5b are high, or the thickness of the n-type drift layer 5a and the thickness of the n-type drift layer 5b are large, and it is not necessary to stop the depletion layer extending in the n-type drift layer 5a and the n-type drift layer 5b when the semiconductor device is turned off, the FS layer does not need to be formed.

That is, as shown with an example in FIG. 2, the p-type collector region 2 may be in contact with the lower surface of the n-type drift layer 5a, and the n-type cathode region 3 may be in contact with the lower surface of the n-type drift layer 5b.

In the IGBT region, the p-type collector region 2 is formed in contact with the lower surface of the n-type drift layer 5a.

The impurity concentration of the p-type collector region 2 is, for example, $1 \times 10^{18}$ cm$^{-3}$ or more and $1 \times 10^{21}$ cm$^{-3}$ or less. In addition, the thickness of the p-type collector region 2 is, for example, within a range of 0.1 μm or more and 3 μm or less.

The p-type base region 6a, the n-type emitter region 7, and the p-type base contact region 8a are formed in the surface layer of the n-type drift layer 5a.

The impurity concentration of the p-type base region 6a is, for example, within a range of $1\times10^{17}$ cm$^{-3}$ or more and $1\times10^{19}$ cm$^{-3}$ or less.

The impurity concentration of the n-type emitter region 7 is, for example, within a range of $1\times10^{18}$ cm$^{-3}$ or more and $1\times10^{20}$ cm$^{-3}$ or less.

The impurity concentration of the p-type base contact region 8a is, for example, within a range of $1\times10^{19}$ cm$^{-3}$ or more and $1\times10^{21}$ cm$^{-3}$ or less.

In addition, the impurity concentration of the p-type base region 6a, the impurity concentration of the n-type emitter region 7, and the impurity concentration of the p-type base contact region 8a may be a "box profile" being constant in the thickness direction of the semiconductor device, or may be an "inclined (or gradient) profile" or a "retrograde profile" having a gradient in the thickness direction of the semiconductor device.

The thickness of the p-type base region 6a is, for example, within a range of 0.5 μm or more and 3 μm or less.

The thickness of the n-type emitter region 7 is, for example, within a range of 0.2 μm or more and 1 μm or less.

The thickness of the p-type base contact region 8a is, for example, within a range of 0.2 μm or more and 1 μm or less.

In addition, the interposition of the insulating film 10 forms the gate electrode 9 to be separated from the p-type base region 6a.

In the FWD region, the n-type cathode region 3 is formed in contact with the lower surface of the n-type drift layer 5b.

The impurity concentration of the n-type cathode region 3 is, for example, within a range of $1\times10^{18}$ cm$^{-3}$ or more and $1\times10^{21}$ cm$^{-3}$ or less. In addition, the thickness of the n-type cathode region 3 is, for example, within a range of 0.1 μm or more and 3 μm or less.

The p-type anode region 6b and the p-type anode contact region 8b are formed in the surface layer of the n-type drift layer 5b.

The impurity concentration of the p-type anode region 6b is, for example, within a range of $1\times10^{17}$ cm$^{-3}$ or more and $1\times10^{19}$ cm$^{-3}$ or less.

The impurity concentration of the p-type anode contact region 8b is, for example, within a range of $1\times10^{19}$ cm$^{-3}$ or more and $1\times10^{21}$ cm$^{-3}$ or less.

In addition, the impurity concentration of the p-type anode region 6b and the impurity concentration of the p-type anode contact region 8b may be a "box profile" being constant in the thickness direction of the semiconductor device, or may be an "inclined (or gradient) profile" or a "retrograde profile" having a gradient in the thickness direction of the semiconductor device.

The thickness of the p-type anode region 6b is, for example, within a range of 0.5 μm or more and 3 μm or less.

The thickness of the p-type anode contact region 8b is desirably, for example, within a range of 0.2 μm or more and 1 μm or less.

The emitter electrode 11 is in ohmic contact with the n-type emitter region 7, the p-type base contact region 8a, and the p-type anode contact region 8b, and is formed to be separated from the gate electrode 9 with the interposition of the insulating film 10.

It should be noted that in the SiC-RC-IGBT 100, the gate electrode 9 is also formed in the FWD region, but since it is not originally necessary to form a channel in the FWD region, the gate electrode 9 does not need to be formed in the FWD region.

Omitting the gate electrode 9 in the FWD region allows a capacitance component to be reduced. Therefore, it is possible to increase the speed of the FWD.

On the lower surface of the SiC-RC-IGBT 100, the collector electrode 1 in ohmic contact with the p-type collector region 2 and the n-type cathode region 3 is formed.

Furthermore, the high carrier lifetime region 12a is formed in the partial region on the p-type collector region 2 side in the n-type drift layer 5a in the IGBT region. In addition, the high carrier lifetime region 12b is formed in the partial region on the p-type anode region 6b side in the n-type drift layer 5b in the FWD region.

Since the high carrier lifetime region 12a is part of the n-type drift layer 5a, the conductivity type or impurity concentration is the same as that of the n-type drift layer 5a.

Similarly, since the high carrier lifetime region 12b is part of the n-type drift layer 5b, the conductivity type or impurity concentration is the same as that of the n-type drift layer 5b.

The carrier lifetime in the high carrier lifetime region 12a is higher than that of the n-type drift layer 5a by one digit or more, and is, for example, within a range of 3 μs or more and 50 μs or less. On the other hand, the carrier lifetime in the n-type drift layer 5a is, for example, 1 μs or less.

Similarly, the carrier lifetime in the high carrier lifetime region 12b is higher than that of the n-type drift layer 5b by one digit or more, and is, for example, within a range of 3 μs or more and 50 μs or less. On the other hand, the carrier lifetime in the n-type drift layer 5b is, for example, 1 μs or less.

Furthermore, it is desirable that the larger the thickness of the drift layer (that is, the higher the withstand voltage performance of the semiconductor device), the longer the carrier lifetime in the high carrier lifetime region 12a and the carrier lifetime in the high carrier lifetime region 12b.

More specifically, for example, when the thickness of the drift layer is 100 μm, the carrier lifetime is set to 3 μs or more, and when the thickness of the drift layer is 250 μm, the carrier lifetime is set to 20 μs or more.

This is because a longer carrier lifetime is required to obtain a sufficient conductivity modulation effect as the thickness of the drift layer increases.

The carrier lifetime can be measured by, for example, a microwave photo conductivity decay (μ-PCD) method, a photo luminescence (PG) method, a free carrier absorption (FCA) method, or the like.

In addition, in the IGBT region, the closer the thickness of the high carrier lifetime region 12a is to the thickness of the n-type drift layer 5a, the more the energization capacity is improved and the turn-off loss increases. In addition, in the FWD region, the closer the thickness of the high carrier lifetime region 12b is to the thickness of the n-type drift layer 5b, the more the energization capacity is improved, and the recovery loss increases. Therefore, the thickness of the high carrier lifetime region is appropriately selected according to the energization capacity required for each of the IGBT and the FWD.

In addition, the high carrier lifetime region 12a and the high carrier lifetime region 12b may be in contact with each other at a boundary between the IGBT region and the FWD region, or may be separated from each other.

In the present embodiment, an example is illustrated in which the high carrier lifetime region 12a and the high carrier lifetime region 12b are separated from each other at the boundary between the IGBT region and the FWD region.

From the viewpoint of reducing the turn-off loss of the IGBT or the recovery loss of the FWD, it is desirable that the high carrier lifetime region 12a and the high carrier lifetime region 12b are separated from each other. The reason will be described below.

In order to reduce the turn-off loss of the IGBT region and the recovery loss of the FWD, it is necessary to quickly remove minority carriers accumulated in the high carrier lifetime region at the time of turn-off of the IGBT region and at the time of recovery of the FWD region, that is, in a transition period from a current conduction state to a high voltage holding state.

For this purpose, it is required to discharge minority carriers accumulated in the IGBT region to the emitter electrode 11 through the p-type base contact region 8a of the same IGBT region, and to discharge minority carriers accumulated in the FWD region to the emitter electrode 11 through the p-type anode contact region 8b of the same FWD region. It should be noted that in the transition period, it is necessary to suppress movement of minority carriers between the IGBT region and the FWD region.

Here, a situation in which the IGBT region is turned off will be considered as an example. When the high carrier lifetime region 12a and the high carrier lifetime region 12b are in contact with each other at the boundary between the IGBT region and the FWD region, a path is formed in which minority carriers accumulated in the IGBT region are discharged through the p-type anode contact region 8b of the FWD region. Therefore, the accumulated minority carriers cannot be efficiently removed.

On the other hand, when the high carrier lifetime region 12a and the high carrier lifetime region 12b are separated from each other at the boundary between the IGBT region and the FWD region, the minority carriers accumulated in the IGBT region are discharged only through the p-type base contact region 8a of the same IGBT region. Therefore, the accumulated minority carriers can be efficiently removed, and as a result, the turn-off loss in the IGBT region is reduced.

Therefore, it is desirable to separate the high carrier lifetime region 12a and the high carrier lifetime region 12b at the boundary between the IGBT region and the FWD region.

In addition, in order to reliably suppress movement of minority carriers between the IGBT region and the FWD region in the transition period, the interval between the high carrier lifetime region 12a and the high carrier lifetime region 12b is desirably at least equal to or larger than the thickness of the n-type drift layer 5a or equal to or larger than the thickness of the n-type drift layer 5b.

FIGS. 3, 4, 5, and 6 are plan views when illustration of an electrode and an insulating film in FIG. 2 is omitted. That is, an X2-X2' cross section in each of FIGS. 3, 4, 5, and 6 corresponds to FIG. 2.

Figure 3:
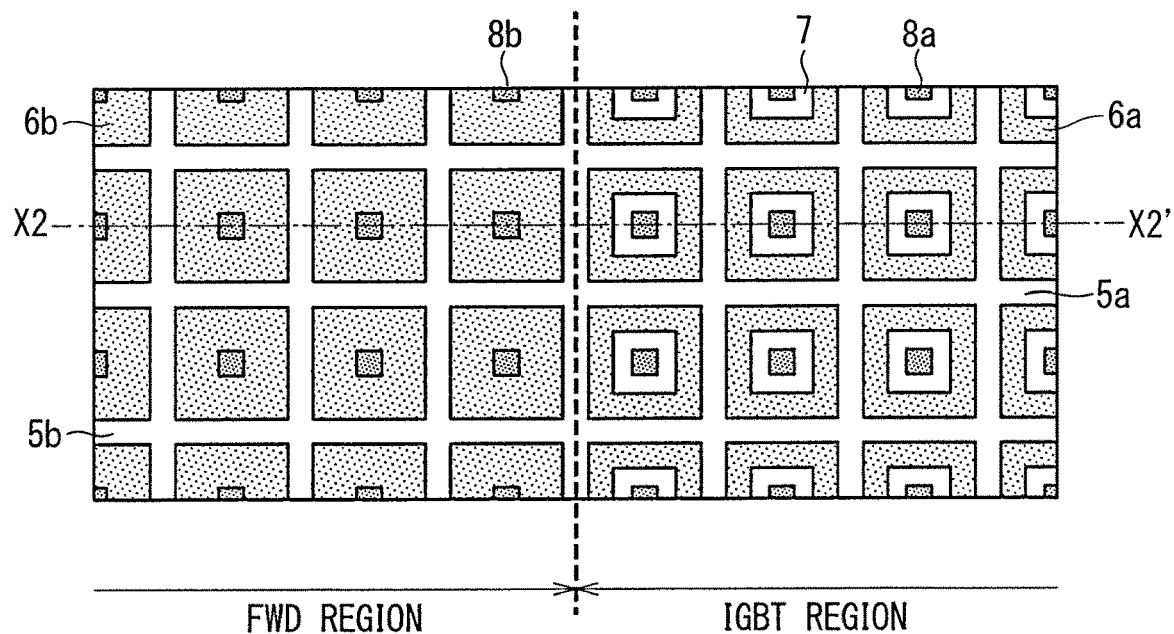
FIG. 3 is a plan view when illustration of an electrode and an insulating film in FIG. 2 is omitted.
Figure 4:
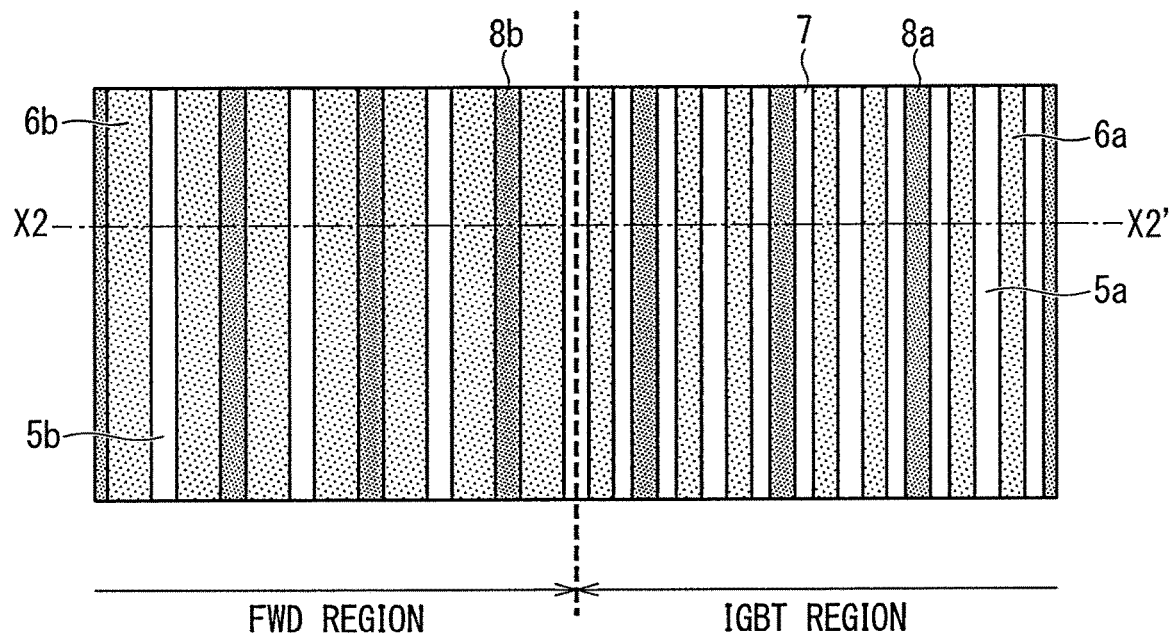
FIG. 4 is a plan view when illustration of the electrode and the insulating film in FIG. 2 is omitted.
Figure 5:
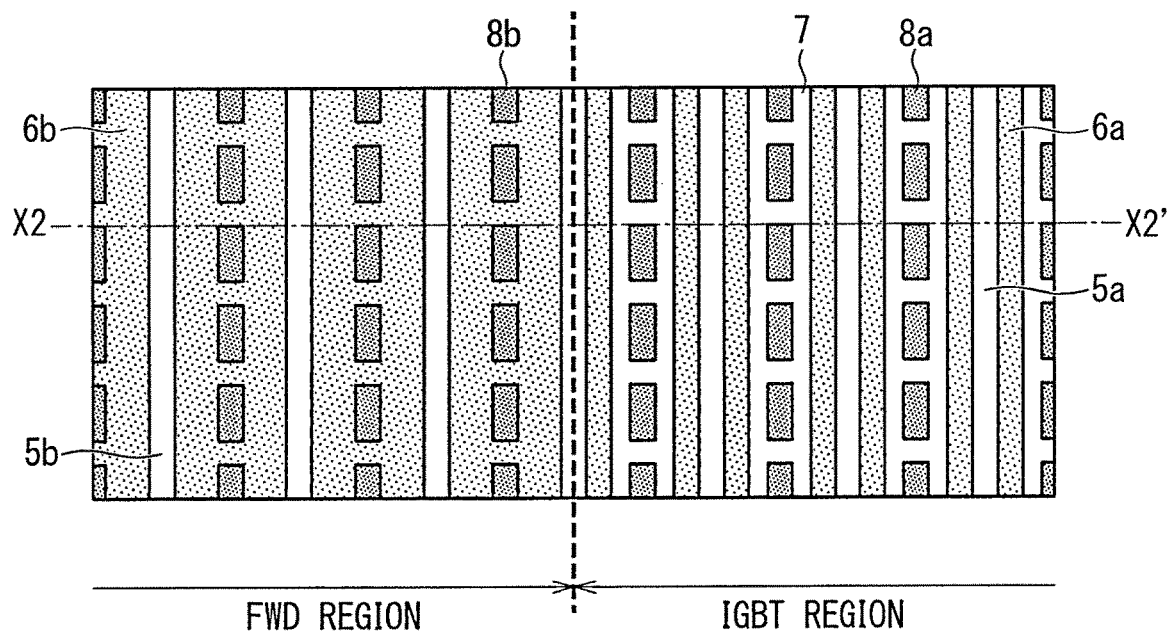
FIG. 5 is a plan view when illustration of the electrode and the insulating film in FIG. 2 is omitted.
Figure 6:
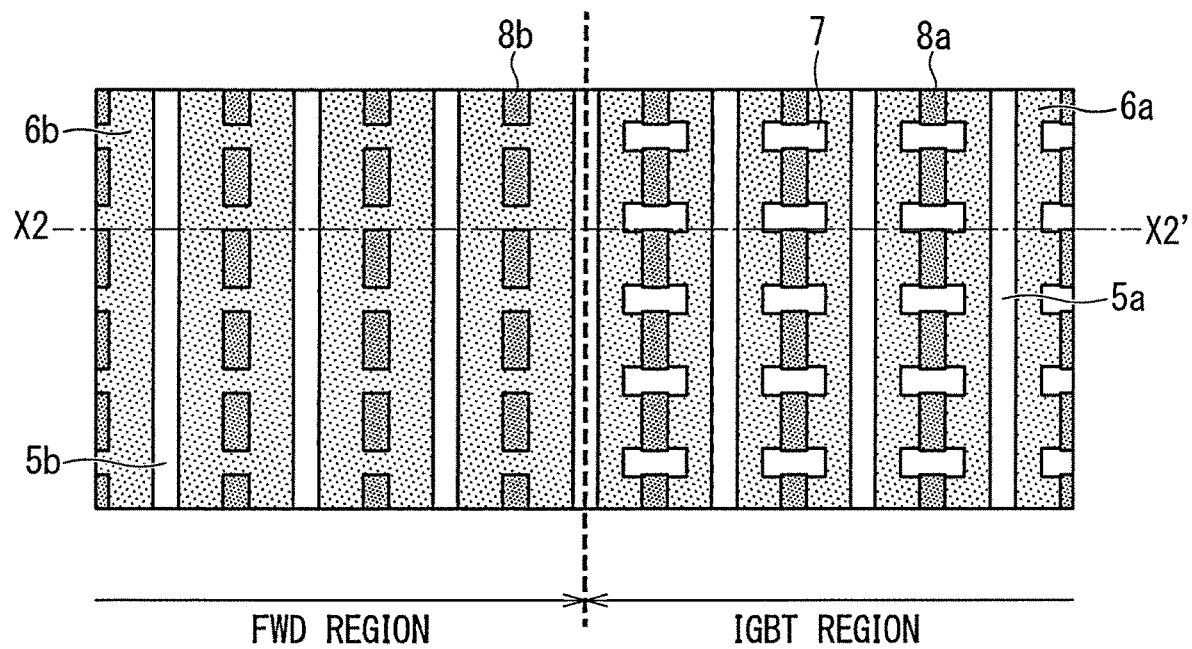
FIG. 6 is a plan view when illustration of the electrode and the insulating film in FIG. 2 is omitted.

FIGS. 3, 4, 5, and 6 show four types of arrangement examples of unit cells, and FIG. 3 shows a case where the unit cells are arranged in a lattice shape, FIG. 4 shows a case where the unit cells are arranged in a comb shape, FIG. 5 shows a case where the unit cells are arranged in a ladder shape, and FIG. 6 shows a case where the unit cells are arranged in a stripe shape.

It should be noted that although FIGS. 3, 4, 5, and 6 show examples in which the cell arrangement is the same in both the IGBT region and the FWD region, the cell arrangement may be different between the IGBT region and the FWD region. For example, the cell arrangement in the IGBT region may be a stripe shape, and the cell arrangement in the FWD region may be a comb shape.

<Method for Manufacturing Semiconductor Device>

Next, a method for manufacturing the semiconductor device (specifically, the planar gate type SiC-RC-IGBT) according to the present embodiment will be described with reference to FIGS. 7 to 17. It should be noted that FIGS. 7, 8, 9, 10, 11, 12, 15, 16, and 17 are cross-sectional views showing examples of manufacturing steps of the semiconductor device according to the present embodiment.

Figure 7:
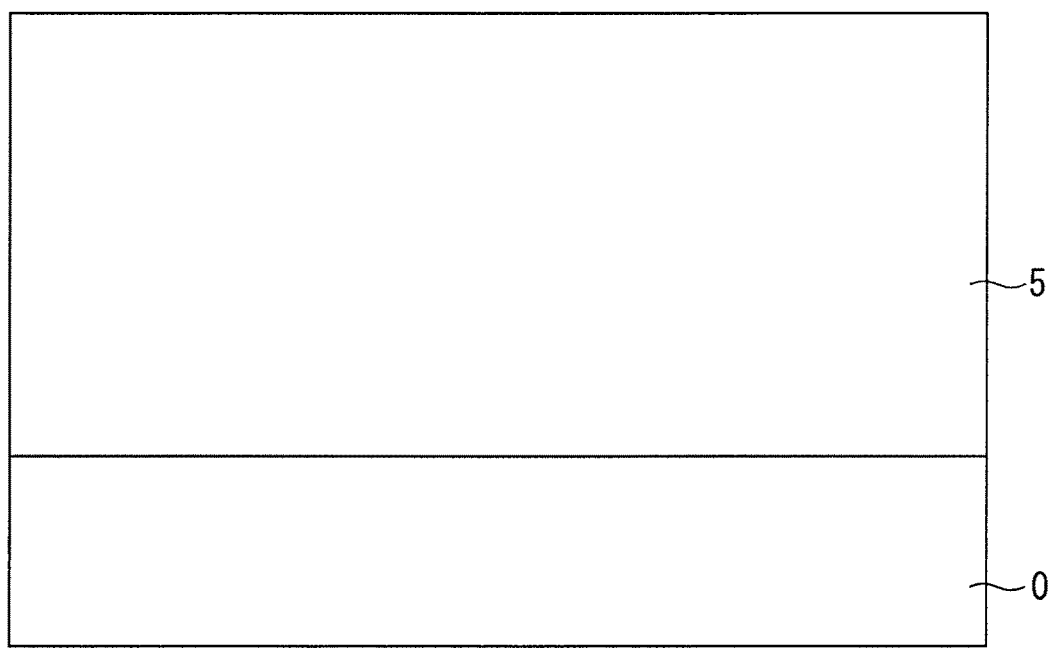
FIG. 7 is a cross-sectional view showing an example of a manufacturing step of the semiconductor device according to the embodiment.

First, as shown with an example in FIG. 7, the n-type drift layer 5 is formed on the upper surface of an n-type SiC support substrate 0 by an epitaxial growth method.

Here, an n-type or p-type buffer layer having an impurity concentration higher than that of the n-type drift layer 5 may be formed between the n-type SiC support substrate 0 and the n-type drift layer 5.

According to this configuration, since basal plane dislocation (BPD), being crystal defects included in the n-type SiC support substrate 0 can be converted into a threading edge dislocation (TED) in the buffer layer, an n-type drift layer 5 not including BPD or having a remarkably low BPD density can be formed.

Next, the lower surface of the n-type SiC support substrate 0 is processed by grinding, polishing, chemical mechanical polishing (CMP), reactive ion etching (RIE), a combination of these methods, or another method, and the n-type SiC support substrate 0 is removed.

Figure 8:
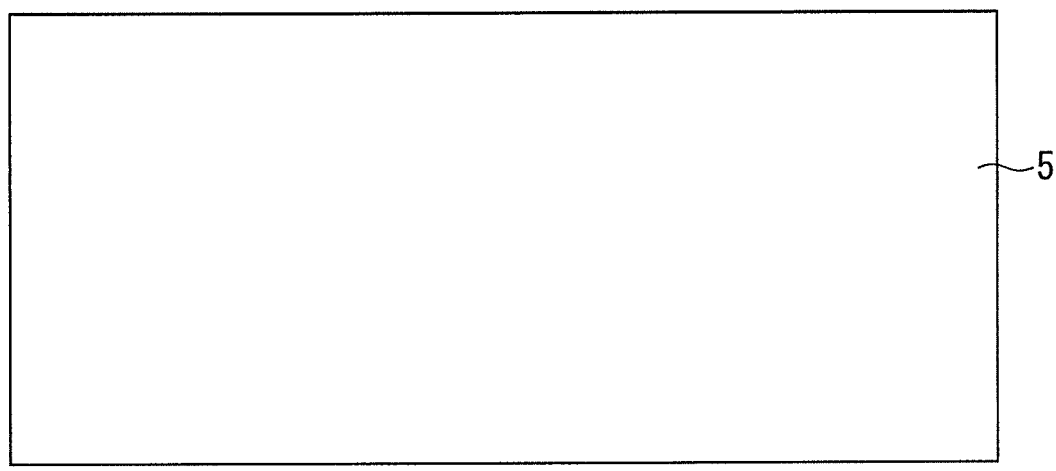
FIG. 8 is a cross-sectional view showing the example of the manufacturing step of the semiconductor device according to the embodiment.
Figure 9:
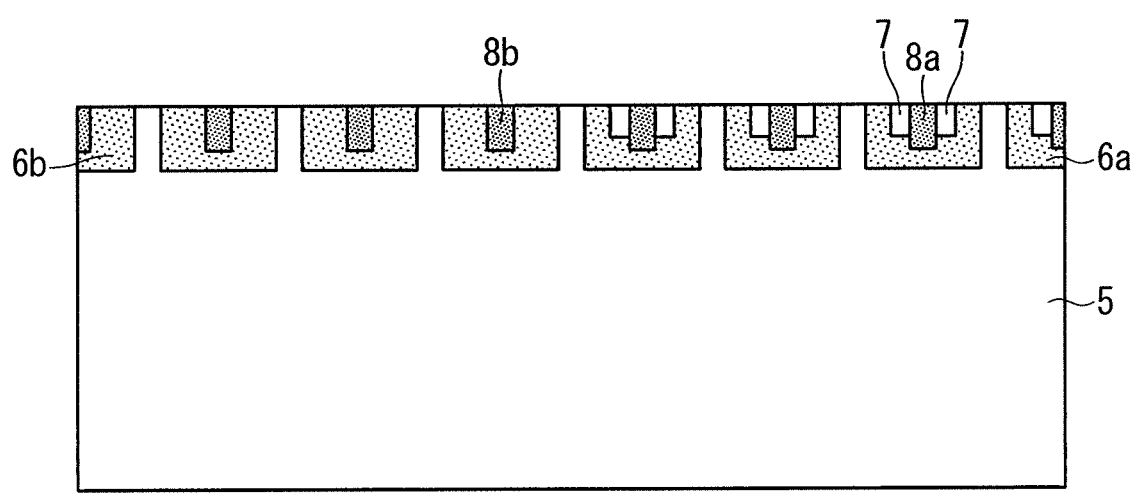
FIG. 9 is a cross-sectional view showing the example of the manufacturing step of the semiconductor device according to the embodiment.
Figure 10:
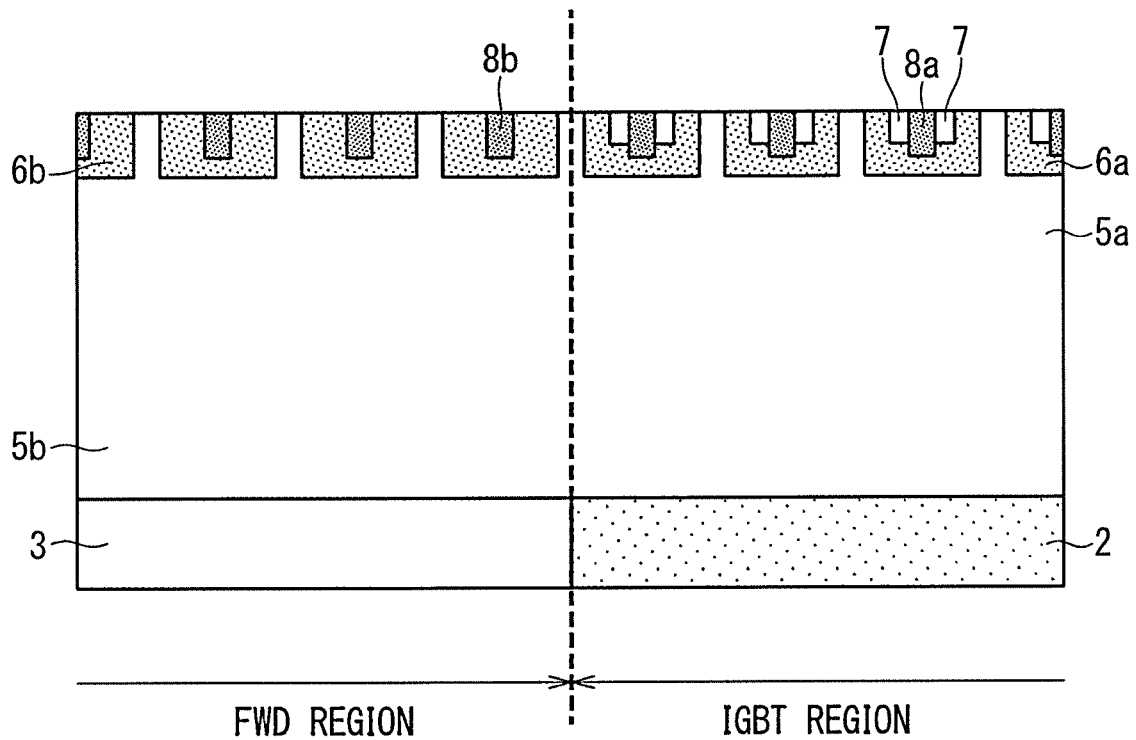
FIG. 10 is a cross-sectional view showing the example of the manufacturing step of the semiconductor device according to the embodiment.

Thus, as shown with an example in FIG. 8, the n-type SiC support substrate 0 is removed, and the lower surface of the n-type drift layer 5 is exposed. It should be noted that the thickness of the n-type drift layer 5 may be the same or different before and after the processing.

Next, ion implantation treatment is performed on a partial region of the upper surface of the n-type drift layer 5. Thus, as shown with an example in FIG. 9, the p-type base region 6a, the n-type emitter region 7, the p-type base contact region 8a, the p-type anode region 6b, and the p-type anode contact region 8b are formed in the surface layer of the upper surface of the n-type drift layer 5.

The p-type base region 6a and the p-type anode region 6b, or the p-type base contact region 8a and the p-type anode contact region 8b may be formed at the same timing, or may be formed at different timings.

The ion implantation treatment may be performed with single implantation energy or may be performed with stepwise implantation energy, for example, while changing the implantation energy from high energy to low energy.

In addition, the ion implantation treatment is performed via an implantation mask in order to perform ion implantation on a predetermined region. As the implantation mask, for example, a photoresist or oxide film for photoengraving is used.

Examples of the impurity element used in the ion implantation treatment include phosphorus and nitrogen in order to achieve n-type conductivity and include aluminum and boron in order to achieve p-type conductivity.

It should be noted that in the ion implantation treatment, part or all of the treatment are performed by setting the temperature of the n-type drift layer 5 within a range of, for example, 10° C. or higher and 1000° C. or lower, more desirably 100° C. or higher and 600° C. or lower. Thus, it is possible to obtain an effect that crystal defects (implantation defects) occurring at the time of ion implantation can be recovered to some extent.

Next, ion implantation treatment is performed on a partial region of the lower surface of the n-type drift layer 5. Thus, as shown with an example in FIG. 10, the p-type collector region 2 and the n-type cathode region 3 are formed.

Here, for convenience, a region on a side where the p-type collector region 2 is formed is the IGBT region, a region on a side where the n-type cathode region 3 is formed is the FWD region, a drift layer in the IGBT region is the n-type drift layer 5a, and a drift layer in the FWD region is the n-type drift layer 5b.

It should be noted that in the present embodiment, the case where the p-type collector region 2 and the n-type cathode region 3 are formed by ion implantation has been described, but one or both of them may be formed by epitaxial growth.

The epitaxial growth timing may be before or after processing (removal) of the n-type SiC support substrate 0, and can be appropriately changed.

In addition, an n-type FS layer may be formed between the p-type collector region 2 and n-type cathode region 3, and the n-type drift layer 5.

Next, the interstitial carbon-induced ion implantation treatment is performed on each of a partial region of the lower surface of the n-type drift layer 5a and a partial region of the upper surface of the n-type drift layer 5b.

The treatment may be performed with single implantation energy or may be performed with stepwise implantation energy, for example, while changing the implantation energy from high energy to low energy.

Examples of the interstitial carbon-induced ions include carbon, silicon, hydrogen, helium, and the like. In the present embodiment, a case where carbon ions are implanted as interstitial carbon-induced ions into the partial region of the lower surface of the n-type drift layer 5a and the partial region of the upper surface of the n-type drift layer 5b will be described.

Figure 11:
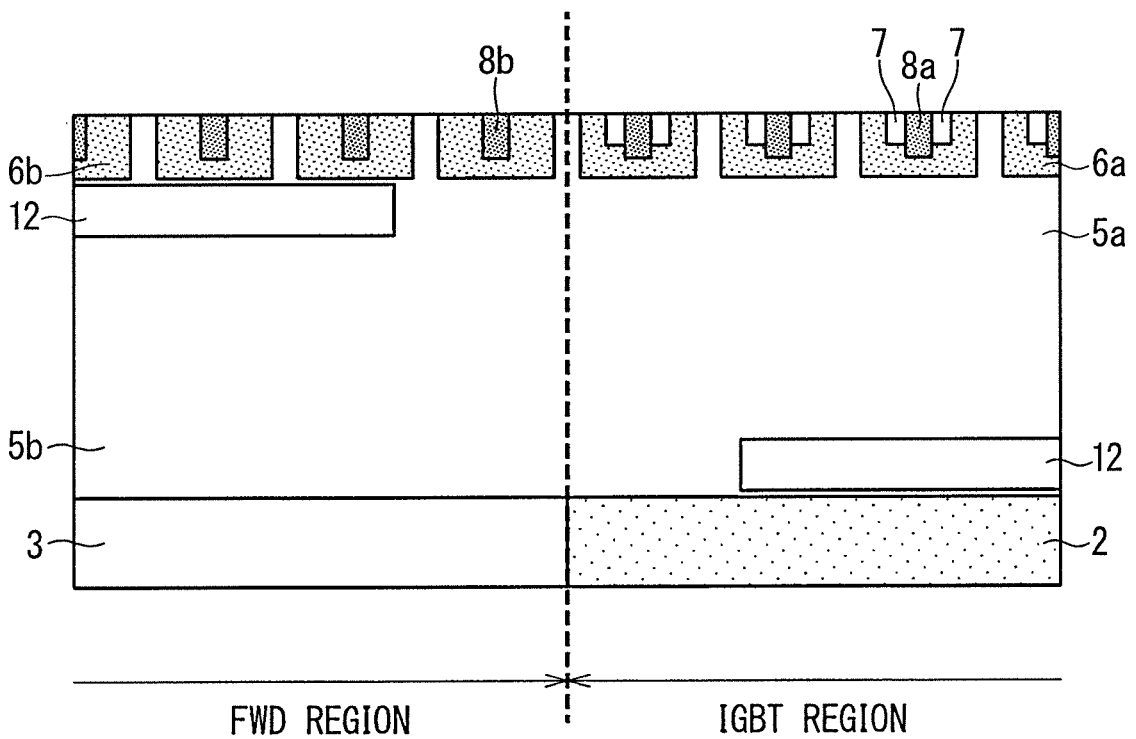
FIG. 11 is a cross-sectional view showing the example of the manufacturing step of the semiconductor device according to the embodiment.

As shown with an example in FIG. 11, the carbon ion implantation treatment forms a region (excess interstitial carbon-containing region 12) where excess interstitial carbon atoms exist. An ion implantation dose amount in the carbon ion implantation treatment is, for example, within a range of $1\times10^{13}$ cm$^{-2}$ or more and $1\times10^{16}$ cm$^{-2}$ or less. In addition, implantation energy in the carbon ion implantation treatment is, for example, within a range of 10 keV or more and 10 MeV or less. The implantation energy in the carbon ion implantation treatment is desirable to be the energy exceeding the implantation energy for forming the anode region and the collector region.

Thus, the excess interstitial carbon-containing region 12 can be formed inside the n-type drift layer 5a and inside the n-type drift layer 5b (inner side of pn junction portion).

In addition, it is desirable that the region on which the carbon ion implantation treatment is performed is spaced from the boundary between the IGBT region and the FWD region to some extent. Specifically, it is desirable to provide a spacing larger than the thickness of the n-type drift layer 5a or the thickness of the n-type drift layer 5b.

In addition, the temperatures of the n-type drift layer 5a and the n-type drift layer 5b in the carbon ion implantation treatment are, for example, within the range of 10° C. or higher and 1000° C. or lower, and desirably within the range of 500° C. or higher and 800° C. or lower.

The ion implantation dose amount or implantation energy in the carbon ion implantation treatment may be the same or different in the partial region of the lower surface of the n-type drift layer 5a and the partial region of the upper surface of the n-type drift layer 5b.

Next, heat treatment is performed on the n-type drift layer 5a and the n-type drift layer 5b including the excess interstitial carbon-containing region 12. The temperature of the heat treatment is, for example, within a range of 1400° C. or higher and 1800° C. or lower, and desirably 1650° C. or lower.

Thus, impurity elements (dopants) in the p-type base region 6a, the n-type emitter region 7, the p-type base contact region 8a, the p-type collector region 2, the p-type anode region 6b, the p-type anode contact region 8b, and the n-type cathode region 3 are activated, and excess interstitial carbon atoms diffuse into the n-type drift layer, and are bonded to an interface between the p-type collector region 2 and the n-type drift layer 5a, an interface between the p-type anode region 6b and the n-type drift layer 5b, that is, implantation defects of a pn junction portion, and further bonded to a $Z_{1/2}$ center present in the n-type drift layer.

Since formed inside the n-type drift layer (inner side of the pn junction portion), the excess interstitial carbon-containing region 12 is efficiently bonded to the implantation defects of the pn junction portion rather than the implantation defects in the p-type collector region 2 or the p-type anode region 6b.

Figure 12:
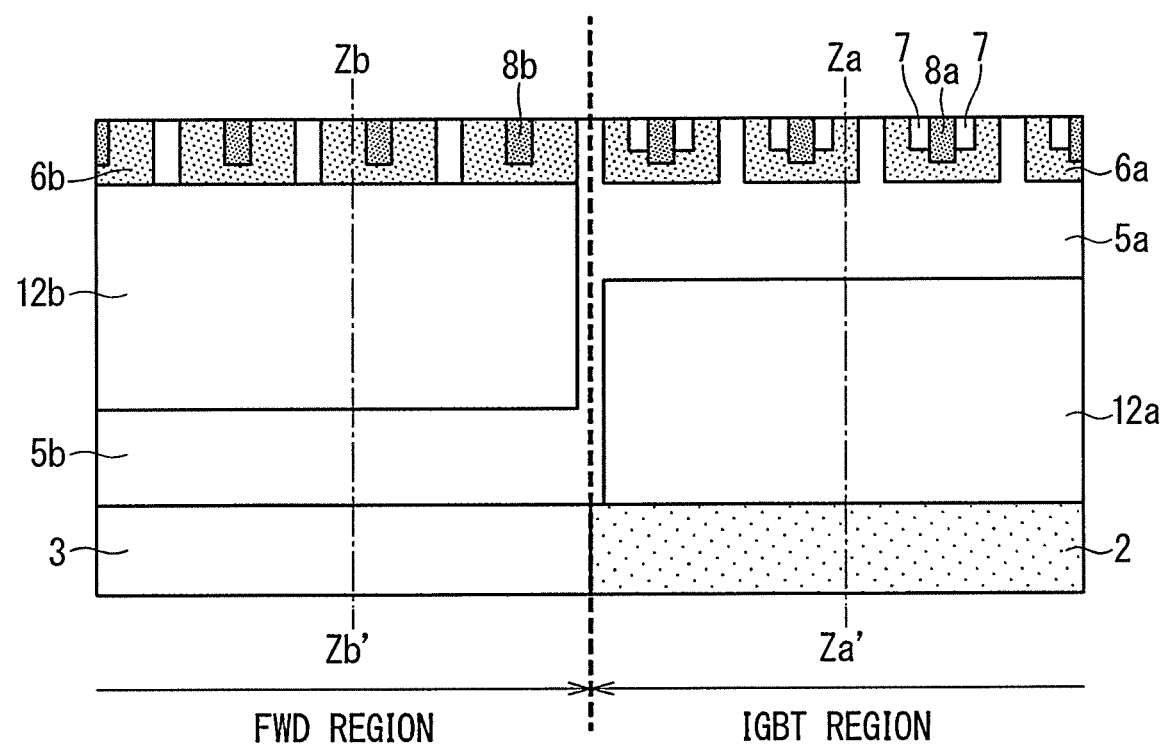
FIG. 12 is a cross-sectional view showing the example of the manufacturing step of the semiconductor device according to the embodiment.

Thus, as shown with an example in FIG. 12, the high carrier lifetime region 12a having a longer carrier lifetime than the n-type drift layer 5a is formed in the partial region on the p-type collector region 2 side in the n-type drift layer 5a in the IGBT region.

In addition, the high carrier lifetime region 12b having a longer carrier lifetime than the n-type drift layer 5b is formed in the partial region on the p-type anode region 6b side in the n-type drift layer 5b in the FWD region.

Here, the $Z_{1/2}$ center refers to a point defect associated with a carbon vacancy in the SiC crystal. It is a generally well-known fact that the $Z_{1/2}$ center becomes a lifetime killer (carrier recombination center) in SiC.

When the density of the $Z_{1/2}$ center is increased, the carrier lifetime in SiC is shortened, the conductivity modulation effect in the current conduction state is not promoted, and a semiconductor device with a low on-voltage cannot be obtained. From the viewpoint of obtaining a long carrier lifetime, the density of the $Z_{1/2}$ center is preferably as low as possible. For example, when the carrier lifetime in the high carrier lifetime region 12a and the high carrier lifetime region 12b is 3 µs or more, the density of the $Z_{1/2}$ center is, for example, $5\times10^{11}$ cm$^{-3}$ or less. The density of the $Z_{1/2}$ center can be measured by, for example, a deep level transient spectroscopy (DLTS) method, an iso-thermal capacitance transient spectroscopy (ICTS) method, or the like.

In addition, the thickness of the high carrier lifetime region 12a and the thickness of the high carrier lifetime region 12b can be appropriately selected by adjusting the conditions of the heat treatment. For example, when the thickness of the high carrier lifetime region 12a and the thickness of the high carrier lifetime region 12b are 100 µm, the temperature of the heat treatment can be set to 1600° C., the time of the heat treatment can be set to 30 minutes, and the like.

Appropriately selecting the thickness of the high carrier lifetime region 12a and the thickness of the high carrier lifetime region 12b and allowing the drift layer having a low carrier lifetime to remain on the base region side of the IGBT region and the cathode region side of the FWD region allows the energization capacity and the turn-off characteristic of the IGBT and the energization capacity and the recovery characteristic of the FWD to be adjusted.

Figure 13:
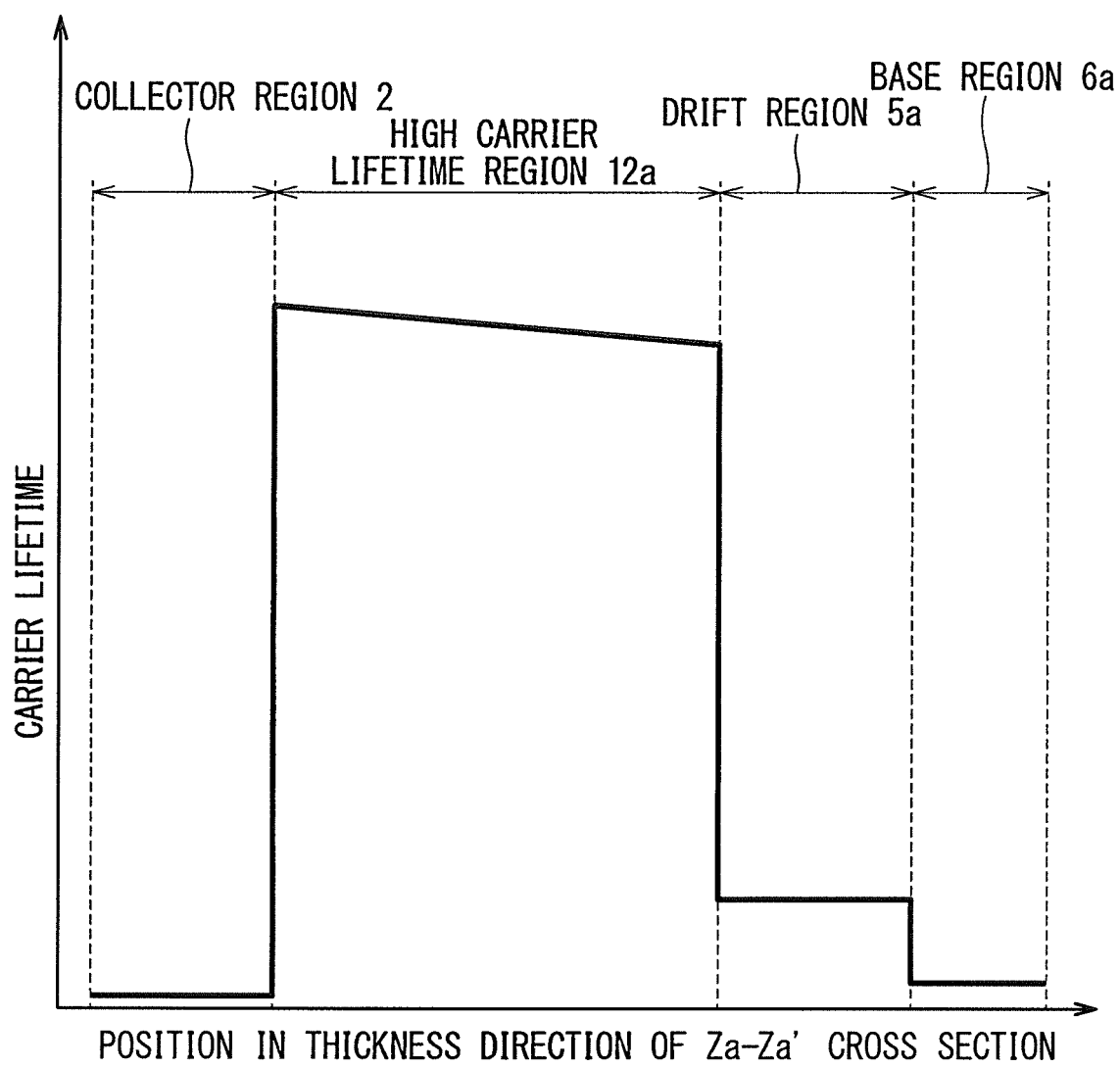
FIG. 13 is a diagram showing an example of carrier lifetime distribution in a cross section taken along line Za-Za' of an IGBT region in FIG. 12.

FIG. 13 is a diagram showing an example of carrier lifetime distribution in a cross section taken along line Za-Za' of the IGBT region in FIG. 12. In addition, FIG. 14 is a diagram showing an example of carrier lifetime distribution in a cross section taken along line Zb-Zb' of the FWD region in FIG. 12.

As shown with an example in FIG. 13, the carrier lifetime of the high carrier lifetime region 12a is longer as it goes toward the p-type collector region 2 side (lower surface side).

Figure 14:
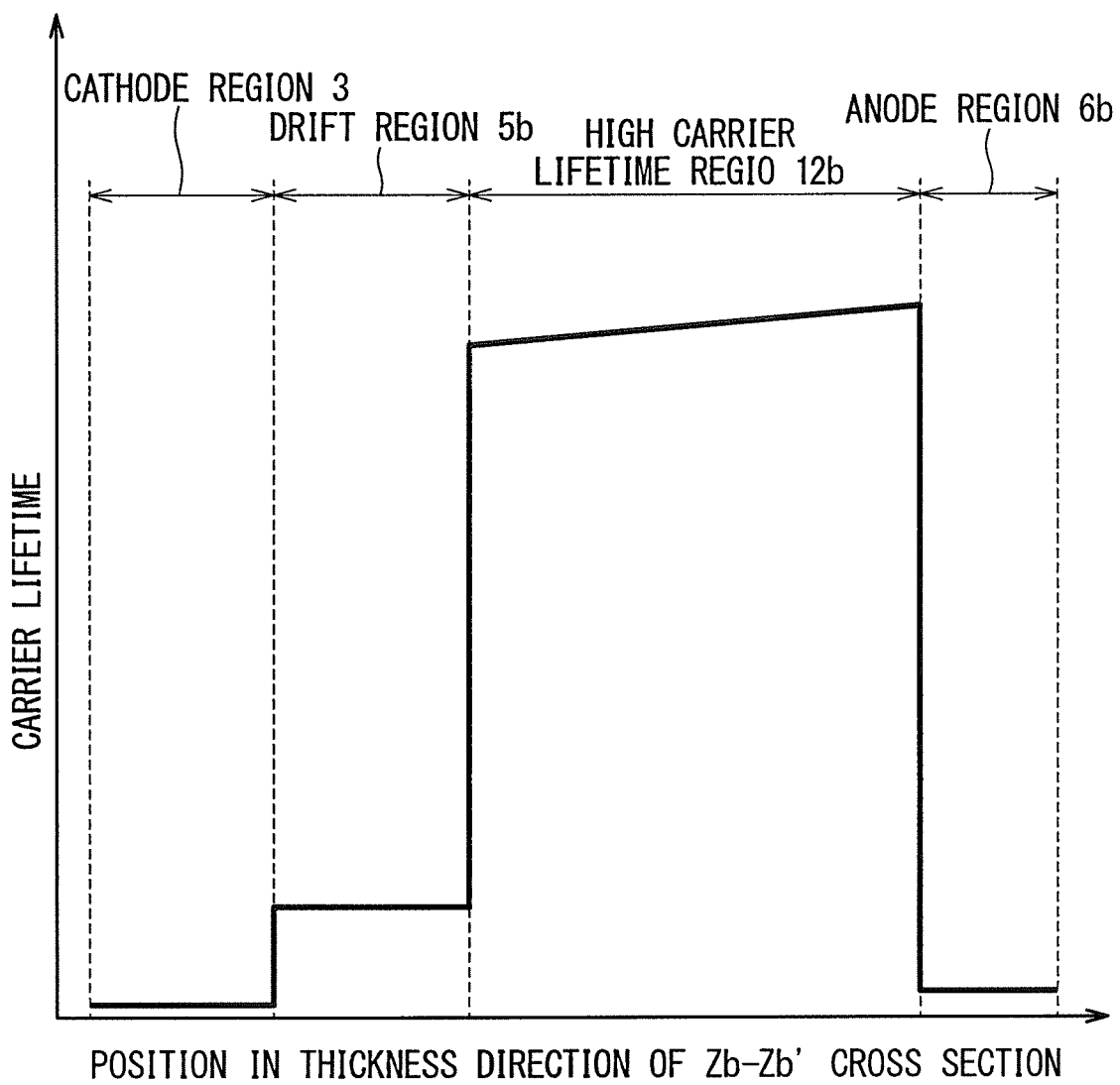
FIG. 14 is a diagram showing an example of carrier lifetime distribution in a cross section taken along line Zb-Zb' of an FWD region in FIG. 12.

In addition, as shown with an example in FIG. 14, the carrier lifetime of the high carrier lifetime region 12b is longer as it goes toward the p-type anode region 6b side (upper surface side).

That is, the closer to the surface on which the carbon ion implantation treatment is performed, the longer the carrier lifetime, and the farther away from the surface, the shorter the carrier lifetime. This is due to the fact that the excess interstitial carbon atoms are bonded to the $Z_{1/2}$ center being the lifetime killer, by diffusion.

In addition, for simplicity, FIGS. 13 and 14 show an example in which the carrier lifetime discontinuously changes at the boundary between the respective regions, but the carrier lifetime may continuously change.

It should be noted that in the present embodiment, an example is shown in which the carbon ion implantation treatment is performed after the ion implantation treatment of the dopant for forming the p-type collector region 2, the n-type cathode region 3, or the like, but the timing of performing the carbon ion implantation treatment can be appropriately changed as long as before the heat treatment is performed on the n-type drift layer. For example, the carbon ion implantation treatment may be performed after processing (removal) of the n-type SiC support substrate 0, and then the ion implantation treatment of various dopants may be performed.

In addition, in the present embodiment, in order to reduce the implantation defects near the pn junction portion and the $Z_{1/2}$ center density in the n-type drift layer, the method of performing the carbon ion implantation treatment and the heat treatment has been described. However, a method may be used of thermally oxidizing at least one of the upper surface and the lower surface of the n-type drift layer to diffuse excess interstitial carbon atoms generated in the process of thermal oxidation into the n-type drift layer.

Next, thermally oxidizing these in an oxygen atmosphere forms an insulating film 10A to be a gate insulating film. The thickness of the insulating film 10A is, for example, within a range of 10 nm or more and 100 nm or less.

In the thermal oxidation, in order to prevent the p-type collector region 2 and the n-type cathode region 3 from being thermally oxidized, the surface where these are exposed may be protected with a deposited oxide film such as a tetra ethyl ortho silicate (TEOS) film.

In the present embodiment, a thermal oxide film of SiC is used as the gate insulating film, but various deposited films such as a high-temperature silicon oxide film (high temperature oxide, i.e. HTO), an aluminum oxide film ($Al_2O_3$), or a hafnium oxide film ($Hf_2O_3$) may be used as the gate insulating film.

Subsequently, the gate electrode 9 is formed as a deposited film in a partial region on the upper surface of the insulating film 10A. As the material of the gate electrode, for example, poly-Si is used.

Figure 15:
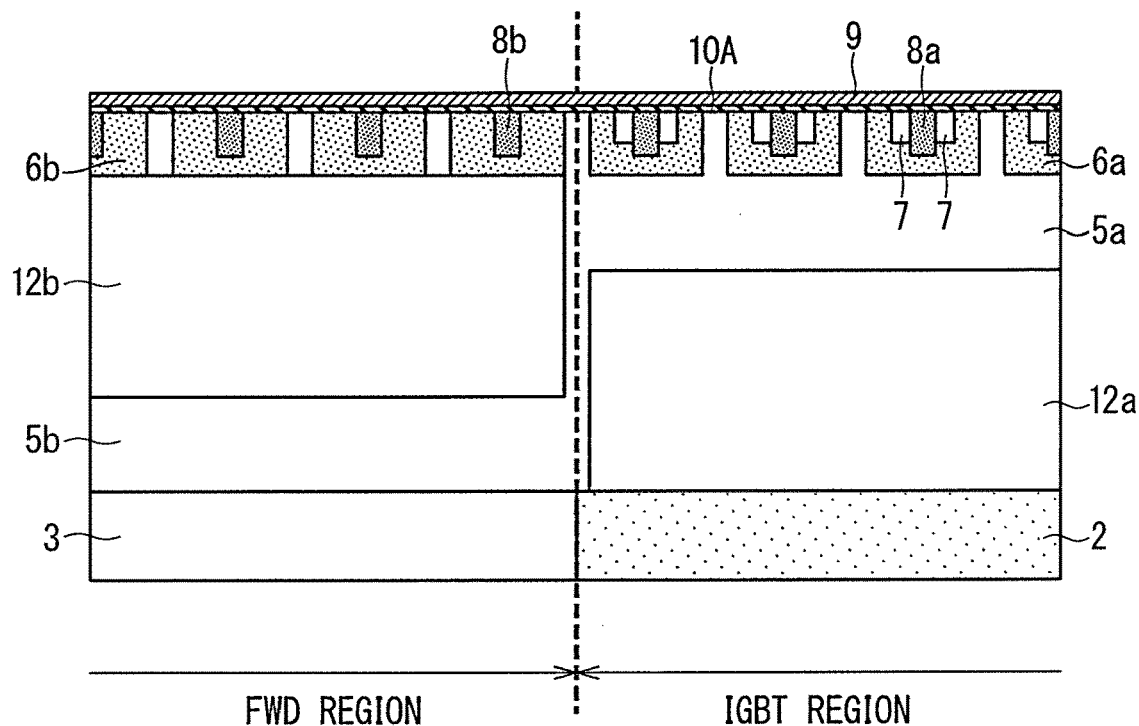
FIG. 15 is a cross-sectional view showing the example of the manufacturing step of the semiconductor device according to the embodiment.

Thus, as shown with an example in FIG. 15, the interposition of the insulating film 10A forms the gate electrode 9 separated from the p-type base region 6a.

Subsequently, part of the gate electrode 9 and part of the insulating film 10A are removed, the insulating film 10 serving as an interlayer insulating film is formed as a deposited film on the upper surface and the side surface of the gate electrode 9, and then the emitter electrode 11 covering the insulating film 10 is formed.

TEOS or the like is used as the insulating film 10, for example. The emitter electrode 11 is made of, for example, aluminum, titanium, nickel, gold, silver, copper, an alloy thereof, or a layered structure thereof. The emitter electrode 11 is formed using, for example, an electron beam evaporation method, a sputtering method, or the like.

Figure 16:
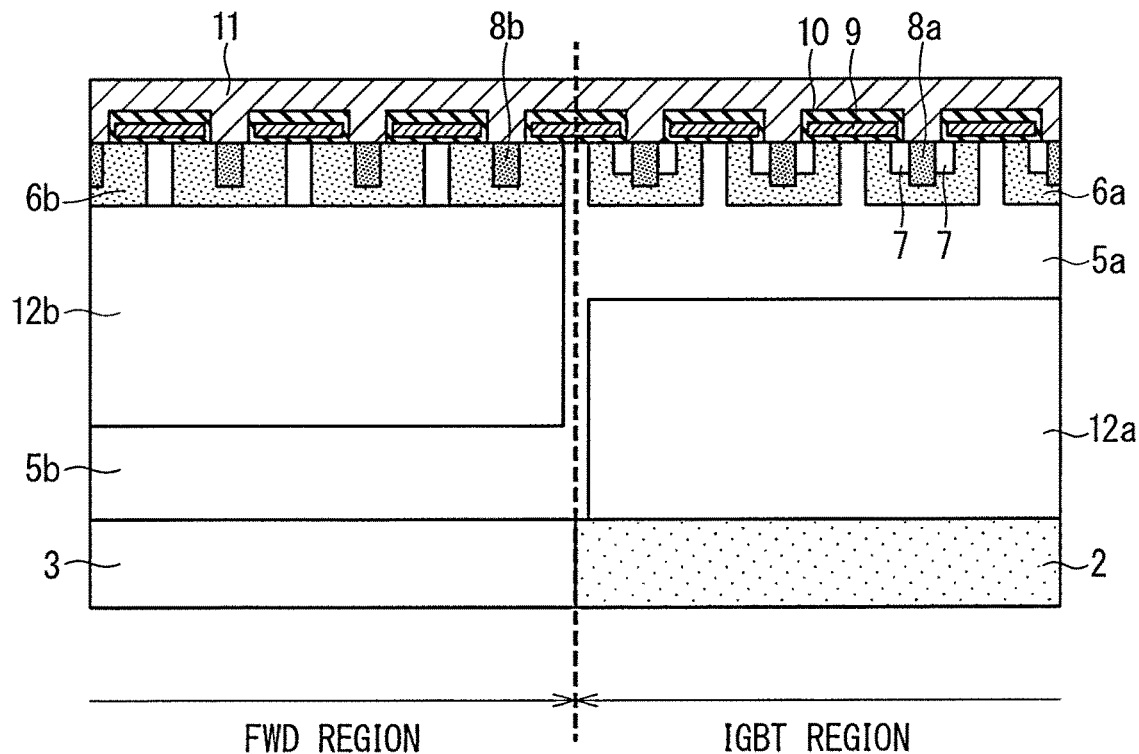
FIG. 16 is a cross-sectional view showing the example of the manufacturing step of the semiconductor device according to the embodiment.
Figure 17:
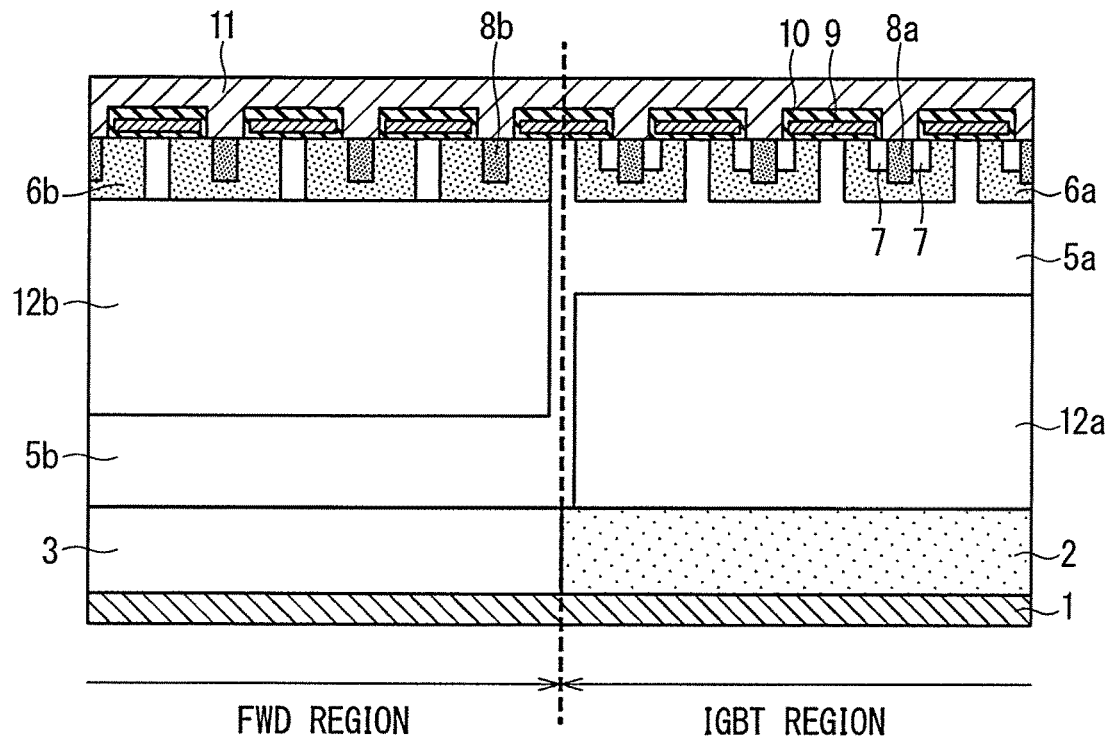
FIG. 17 is a cross-sectional view showing the example of the manufacturing step of the semiconductor device according to the embodiment.

Thus, as shown with an example in FIG. 16, the interposition of the insulating film 10 forms the emitter electrode 11 separated from the gate electrode 9.

The emitter electrode 11 is in ohmic contact with the n-type emitter region 7, the p-type base contact region 8a, and the p-type anode contact region 8b.

Finally, the collector electrode 1 is formed on the exposed surfaces of the p-type collector region 2 and the n-type cathode region 3. Thus, as shown with an example in FIG. 17, the collector electrode 1 is formed on the lower surface opposite to the upper surface on which the emitter electrode 11 is formed.

A material of and a method for forming the collector electrode 1 are similar to those of the emitter electrode 11. The collector electrode 1 is in ohmic contact with the p-type collector region 2 and the n-type cathode region 3.

According to the semiconductor device and the method for manufacturing the semiconductor device described in the present embodiment, the high carrier lifetime region 12a is provided on the p-type collector region 2 side in the n-type drift layer 5a in the IGBT region, and the high carrier lifetime region 12b is provided on the p-type anode region 6b side in the n-type drift layer 5b in the FWD region.

Therefore, minority carrier injection efficiency from the p-type collector region 2 to the n-type drift layer 5a in the IGBT region and minority carrier injection efficiency from the p-type anode region 6b to the n-type drift layer 5b in the FWD region can be improved. As a result, the energization capacity of the SiC-RC-IGBT can be improved.

Furthermore, since the n-type drift layer having a low carrier lifetime remains on the p-type base region 6a side (upper surface side) in the IGBT region and on the n-type cathode region 3 side (lower surface side) in the FWD region, a reduction in turn-off loss in the IGBT region and a reduction in recovery loss in the FWD region can be achieved. That is, it is possible to achieve a SiC-RC-IGBT that secures all of improvement in energization capacity, reduction in turn-off loss, and reduction in recovery loss.

Second Embodiment

A semiconductor device according to the present embodiment will be described. It should be noted that in the following description, the same components as those described in the embodiment described above are denoted by the same reference numerals and illustrated, and the detailed description thereof will be appropriately omitted.

<Configuration of Semiconductor Device>

Figure 18:
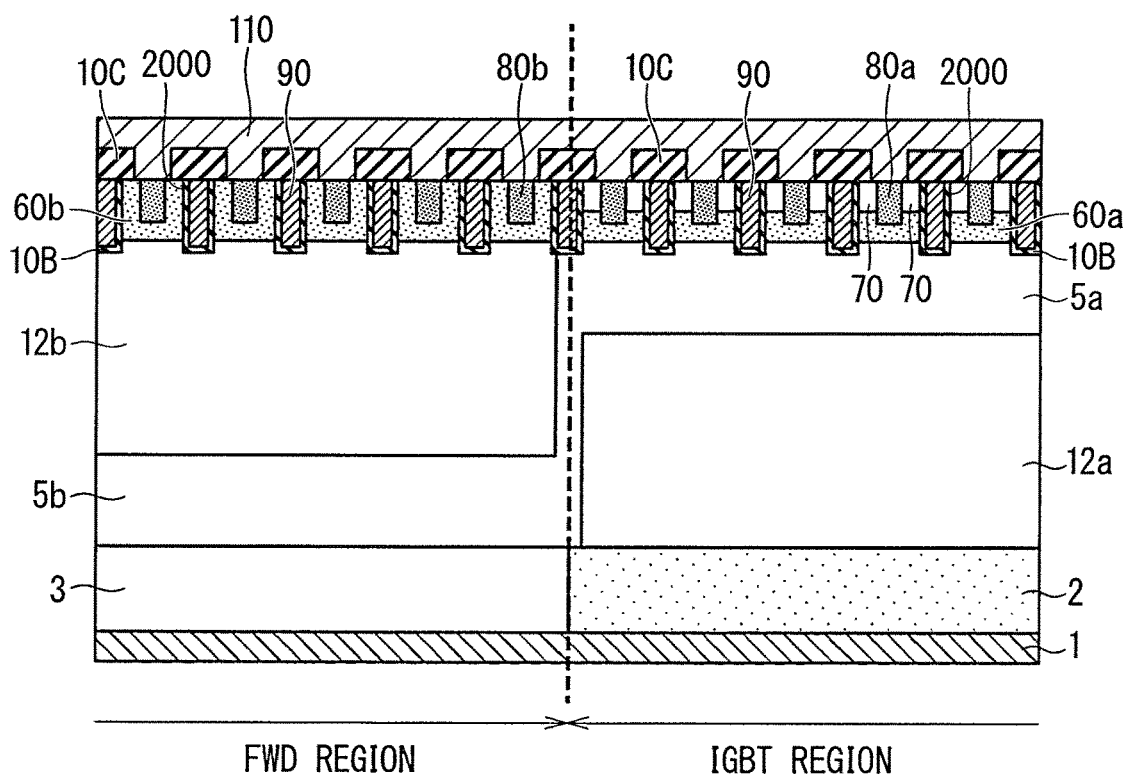
FIG. 18 is a cross-sectional view schematically showing an example of a configuration of a semiconductor device (specifically, a trench gate type SiC-RC-IGBT) according to an embodiment.

FIG. 18 is a cross-sectional view schematically showing an example of a configuration of a semiconductor device (specifically, a trench gate type SiC-RC-IGBT) according to the present embodiment. As shown with an example in FIG. 18, the semiconductor device according to the present embodiment is similar in configuration to the semiconductor device according to the first embodiment. Therefore, in the present embodiment, in particular, portions different from the configuration of the semiconductor device in the first embodiment will be described.

As shown with an example in FIG. 18, an IGBT region of a SiC-RC-IGBT 200 includes: an n-type drift layer 5a, a p-type collector region 2, a p-type base region 60a selectively formed in a surface layer of the n-type drift layer 5a, an n-type emitter region 70 selectively formed in a surface layer of the p-type base region 60a, a p-type base contact region 80a formed to reach inside the p-type base region 60a from the upper surface of the n-type emitter region 70, a trench 2000 leading from the upper surface of the n-type emitter region 70 to the n-type drift layer 5a through the p-type base region 60a, a gate insulating film 10B formed on the inner wall of the trench 2000, a gate electrode 90 formed in a region surrounded by the gate insulating film 10B in the trench 2000, and an interlayer insulating film 10C formed to cover part of the upper surface of the n-type emitter region 70 and the upper surface of the gate electrode 90.

In addition, as shown with an example in FIG. 18, an FWD region of the SiC-RC-IGBT 200 includes: an n-type drift layer 5b, an n-type cathode region 3, a p-type anode region 60b selectively formed in a surface layer of the n-type drift layer 5b, a p-type anode contact region 80b selectively formed in a surface layer of the p-type anode region 60b, a trench 2000 penetrating the p-type anode region 60b from the upper surface of the p-type anode region 60b, a gate insulating film 10B formed on the inner wall of the trench 2000, a gate electrode 90 formed in a region surrounded by the gate insulating film 10B in the trench 2000, and an interlayer insulating film 10C formed to cover part of the upper surface of the p-type anode region 60b and the upper surface of the gate electrode 90.

In addition, the SiC-RC-IGBT 200 includes an emitter electrode 110 connected to the n-type emitter region 70, the p-type base contact region 80a, and the p-type anode contact region 80b, and a collector electrode 1 connected to the p-type collector region 2 and the n-type cathode region 3.

In addition, the SiC-RC-IGBT 200 includes a high carrier lifetime region 12a having a carrier lifetime higher (that is, longer) than that of the n-type drift layer 5a in a partial region on the p-type collector region 2 side in the n-type drift layer 5a in the IGBT region.

In addition, the SiC-RC-IGBT 200 includes a high carrier lifetime region 12b having a carrier lifetime higher (that is, longer) than that of the n-type drift layer Sb in a partial region on the p-type anode region 60b side in the n-type drift layer 5b in the FWD region.

Since the semiconductor device according to the present embodiment has a trench type gate structure, a cell pitch (that is, the distance between unit cells) is reduced as compared with that of the semiconductor device according to the first embodiment, so that the ratio of a channel width to an area of the unit cell, that is, a channel width density is improved. Therefore, a channel resistance component is reduced, and the energization capacity of the SiC-RC-IGBT can be improved.

Third Embodiment

A semiconductor device according to the present embodiment will be described. It should be noted that in the following description, the same components as those described in the embodiments described above are denoted by the same reference numerals and illustrated, and the detailed description thereof will be appropriately omitted.

Figure 19:
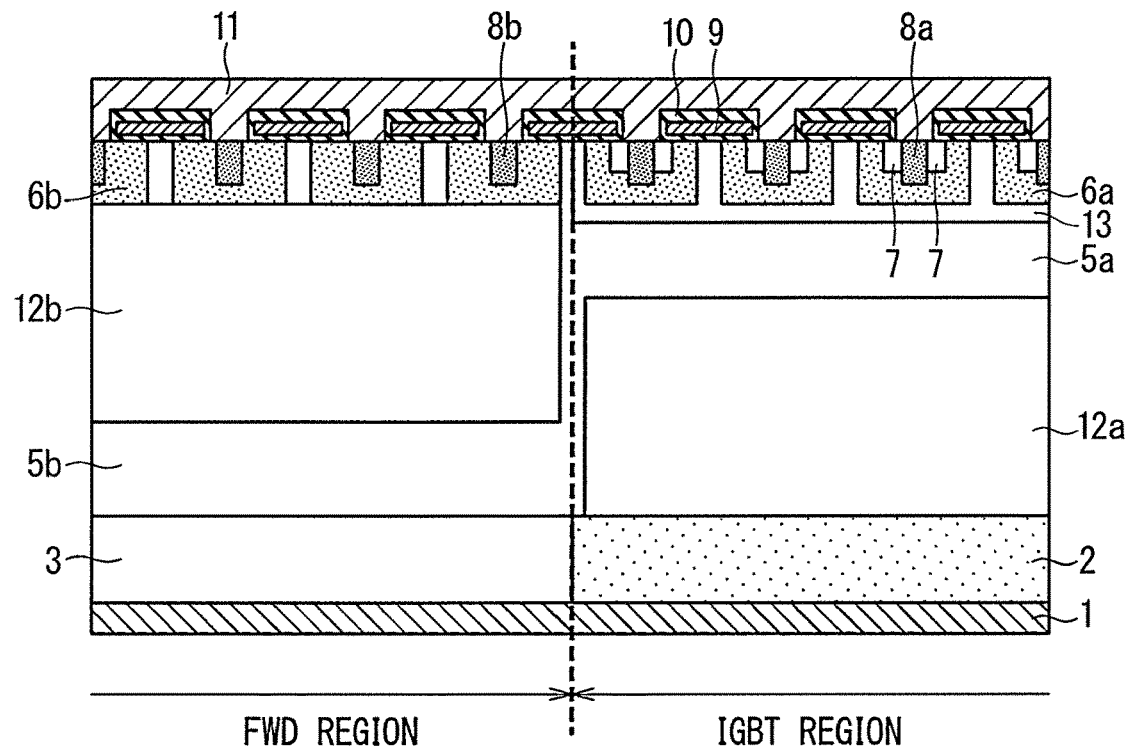
FIG. 19 is a cross-sectional view schematically showing an example of a configuration of a semiconductor device (specifically, a planar gate type SiC-RC-IGBT) according to an embodiment.

FIG. 19 is a cross-sectional view schematically showing an example of a configuration of a semiconductor device (specifically, a planar gate type SiC-RC-IGBT) according to the present embodiment. As shown with an example in FIG. 19, the semiconductor device according to the present embodiment is similar in configuration to the semiconductor device according to the first embodiment. Therefore, in the present embodiment, in particular, portions different from the configuration of the semiconductor device in the first embodiment will be described.

As shown with an example in FIG. 19, an IGBT region of a SiC-RC-IGBT 300 includes: an n-type drift layer 5a, a p-type collector region 2, an n-type carrier accumulation layer 13 selectively formed in the surface layer of the n-type drift layer 5a, a p-type base region 6a selectively formed in the surface layer of the n-type carrier accumulation layer 13, an n-type emitter region 7, a p-type base contact region 8a, an insulating film 10 formed on the upper surface of the p-type base region 6a sandwiched between the n-type emitter region 7 and the n-type carrier accumulation layer 13, and a gate electrode 9 formed on the upper surface of the insulating film 10.

In addition, as shown with an example in FIG. 19, an FWD region of the SiC-RC-IGBT 300 includes: an n-type drift layer 5b, an n-type cathode region 3, a p-type anode region 6b, a p-type anode contact region 8b, an insulating film 10, and a gate electrode 9.

In addition, the SiC-RC-IGBT 300 includes an emitter electrode 11 and a collector electrode 1. In addition, the SiC-RC-IGBT 300 includes a high carrier lifetime region 12a and a high carrier lifetime region 12b.

The impurity concentration of the n-type carrier accumulation layer 13 is, for example, within a range of $1 \times 10^{15}$ $cm^{-3}$ or more and $1 \times 10^{17}$ $cm^{-3}$ or less, and is desirably higher than the impurity concentration of the n-type drift layer 5a.

In addition, the thickness of the n-type carrier accumulation layer 13 is, for example, within a range of 0.1 μm or more and 3 μm or less, and is desirably larger than the thickness of the p-type base region 6a.

The carrier accumulation layer may be formed by an ion implantation method, or may be formed using an epitaxial growth method and an etching technique.

According to the semiconductor device described in the present embodiment, the n-type carrier accumulation layer 13 having an impurity concentration higher than that of the n-type drift layer 5a is formed in the surface layer of the n-type drift layer 5a in the IGBT region. Therefore, in a current conduction state of the IGBT, minority carriers injected from the p-type collector region 2 can be kept (that is, minority carriers that pass through the p-type base region Ga to the emitter electrode 11 are reduced) in the n-type drift layer 5a.

Therefore, since a minority carrier concentration on the emitter side in the n-type drift layer 5a can be increased, the energization capacity of the IGBT can be improved.

Figure 20:
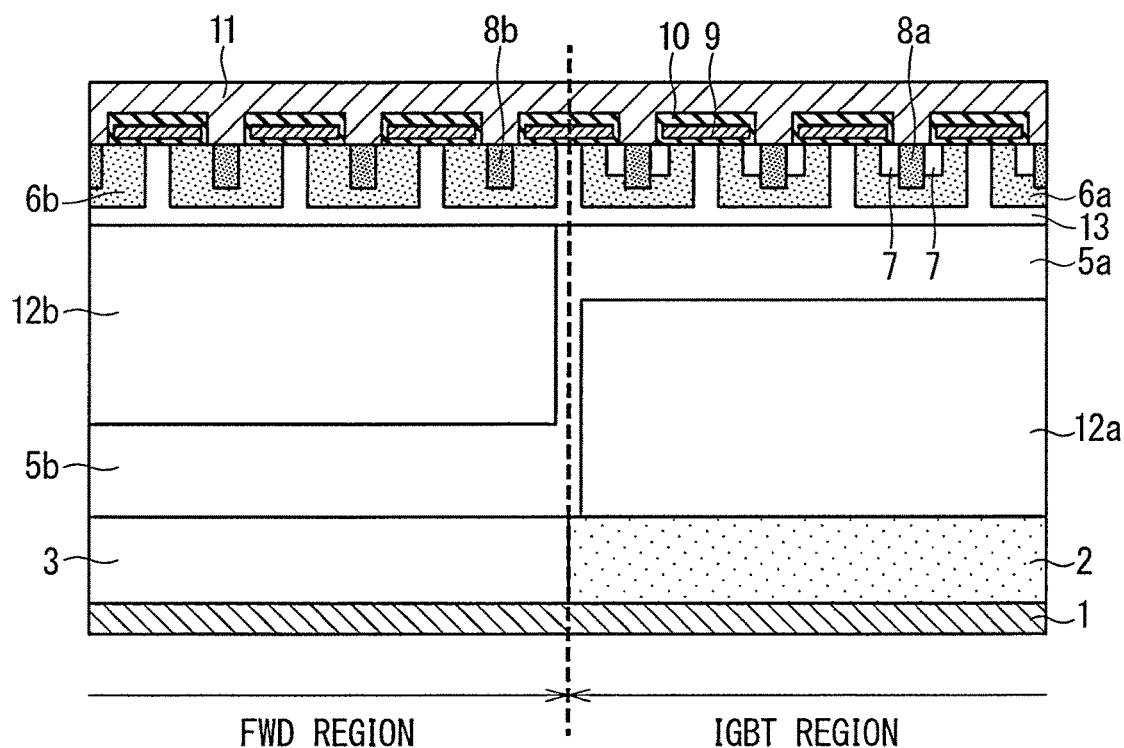
FIG. 20 is a cross-sectional view schematically showing another example of a configuration of the semiconductor device (specifically, the planar gate type SiC-RC-IGBT) according to the embodiment.

It should be noted that FIG. 19 shows a case where the n-type carrier accumulation layer 13 is formed only in the IGBT region, but as shown with an example in FIG. 20, the n-type carrier accumulation layer 13 may also be formed in the FWD region.

FIG. 20 is a cross-sectional view schematically showing another example of a configuration of the semiconductor device (specifically, the planar gate type SiC-RC-IGBT) according to the present embodiment.

As shown with an example in FIG. 20, an IGBT region of a SiC-RC-IGBT 400 includes: an n-type drift layer 5a, a p-type collector region 2, an n-type carrier accumulation layer 13 selectively formed in a surface layer of the n-type drift layer 5a, a p-type base region 6a selectively formed in a surface layer of the n-type carrier accumulation layer 13, an n-type emitter region 7, a p-type base contact region 8a, an insulating film 10 formed on the upper surface of the p-type base region 6a sandwiched between the n-type emitter region 7 and the n-type carrier accumulation layer 13, and a gate electrode 9 formed on the upper surface of the insulating film 10.

In addition, as shown with an example in FIG. 20, an FWD region of the SiC-RC-IGBT 400 includes: an n-type drift layer 5b, an n-type cathode region 3, an n-type carrier accumulation layer 13 selectively formed in a surface layer of the n-type drift layer 5b, a p-type anode region 6b selectively formed in a surface layer of the n-type carrier accumulation layer 13, a p-type anode contact region 8b, an insulating film 10, and a gate electrode 9.

In addition, the SiC-RC-IGBT 400 includes an emitter electrode 11 and a collector electrode 1. In addition, the SiC-RC-IGBT 400 includes a high carrier lifetime region 12a and a high carrier lifetime region 12b.

<Effects Produced by Embodiments Described Above>

Next, examples of effects produced by the above-described embodiments will be shown. It should be noted that in the following description, the effect is described based on the specific configuration exemplified in the above-described embodiments, but in the scope where the same effect is produced, the configuration may be replaced with other specific configurations exemplified in the specification of the present application.

In addition, the replacement may be performed across a plurality of embodiments. That is, the case may be used where the same effects are produced by combining the respective configurations exemplified in different embodiments.

According to the embodiments described above, in the semiconductor device, the IGBT includes: a first drift layer of the first conductivity type (n-type), the collector region 2 of the second conductivity type (p-type), the p-type base region 6a, the n-type emitter region 7, the insulating film 10, the gate electrode 9, and a first high carrier lifetime region. Here, the first drift layer corresponds to, for example, the n-type drift layer 5a. In addition, the first high carrier lifetime region corresponds to, for example, the high carrier lifetime region 12a. The p-type collector region 2 is formed on the lower surface of the n-type drift layer 5a. The p-type base region 6a is selectively formed in the surface layer of the n-type drift layer 5a. The n-type emitter region 7 is selectively formed in the surface layer of the p-type base region 6a. The insulating film 10 is in contact with the p-type base region 6a sandwiched between the n-type emitter region 7 and the n-type drift layer 5a. The gate electrode 9 is in contact with the insulating film 10. The high carrier lifetime region 12a is formed at a position closer to the p-type collector region 2 than the p-type base region 6a in the n-type drift layer 5a. In addition, the high carrier lifetime region 12a is longer in carrier lifetime than the n-type drift layer 5a. In addition, the FWD includes an n-type second drift layer, the p-type anode region 6b, and a second high carrier lifetime region. Here, the second drift layer corresponds to, for example, the n-type drift layer 5b. In addition, the second high carrier lifetime region corresponds to, for example, the high carrier lifetime region 12b. The p-type anode region 6b is selectively formed in the surface layer of the n-type drift layer 5b. The high carrier lifetime region 12b is formed at a position closer to the p-type anode region 6b than the lower surface of the n-type drift layer 5b in the n-type drift layer 5b. In addition, the high carrier lifetime region 12b is longer in carrier lifetime than the n-type drift layer 5b. In addition, the semiconductor device includes the emitter electrode 11 and the collector electrode 1. The emitter electrode 11 is connected to the n-type emitter region 7 and the p-type anode region 6b. In addition, the collector electrode 1 is connected to the p-type collector region 2 and the n-type drift layer 5b.

According to this configuration, it is possible to improve energization capacity by increasing minority carrier injection efficiency, and to achieve reduction in turn-off loss and reduction in recovery loss.

It should be noted that even when at least one of the other configurations exemplified in the specification of the present application is appropriately added to the configurations described above, that is, even when other configurations exemplified in the specification of the present application not mentioned as the configurations described above are added, similar effects can be produced.

In addition, according to the embodiments described above, the carrier lifetime of the high carrier lifetime region 12a is 10 times or more the carrier lifetime of the n-type drift layer 5a. According to this configuration, since the minority carrier injection efficiency from the p-type collector region 2 to the n-type drift layer 5a in the IGBT region is improved, the energization capacity of the SiC-RC-IGBT can be improved.

In addition, according to the embodiments described above, the carrier lifetime of the high carrier lifetime region 12b is 10 times or more the carrier lifetime of the n-type drift layer 5b. According to this configuration, since the minority carrier injection efficiency from the p-type anode region 6b to the n-type drift layer 5b in the FWD region is improved, the energization capacity of the SiC-RC-IGBT can be improved.

In addition, according to the embodiments described above, the carrier lifetime of the high carrier lifetime region 12a is 3 μs or more and 50 μs or less, and the carrier lifetime of the n-type drift layer 5a is 1 μs or less. According to this configuration, since the minority carrier injection efficiency from the p-type collector region 2 to the n-type drift layer 5a in the IGBT region is improved, the energization capacity of the SiC-RC-IGBT can be improved.

In addition, according to the embodiments described above, the carrier lifetime of the high carrier lifetime region 12b is 3 μs or more and 50 μs or less, and the carrier lifetime of the n-type drift layer 5b is 1 μs or less. According to this configuration, since the minority carrier injection efficiency from the p-type anode region 6b to the n-type drift layer 5b in the FWD region is improved, the energization capacity of the SiC-RC-IGBT can be improved.

In addition, according to the embodiments described above, the high carrier lifetime region 12a and the high carrier lifetime region 12b are separated from each other. According to this configuration, minority carriers accumulated in the IGBT region are discharged only through the p-type base contact region 8a in the same IGBT region. Therefore, the accumulated minority carriers can be efficiently removed, and as a result, the turn-off loss in the IGBT region is reduced.

In addition, according to the embodiments described above, the distance between the high carrier lifetime region 12a and the high carrier lifetime region 12b is longer than the thickness of the n-type drift layer 5a or the thickness of the n-type drift layer 5b. According to this configuration, it is possible to reliably suppress movement of minority carriers between the IGBT region and the FWD region in the transition period.

In addition, according to the embodiments described above, the IGBT includes the n-type carrier accumulation layer 13. The n-type carrier accumulation layer 13 is selectively formed in the surface layer of the n-type drift layer 5a. In addition, the n-type carrier accumulation layer 13 is higher in impurity concentration than the n-type drift layer 5a. Then, the p-type base region 6a is selectively formed in the surface layer of the n-type carrier accumulation layer 13. In addition, the insulating film 10 is in contact with the p-type base region 6a sandwiched between the n-type emitter region 7 and the n-type carrier accumulation layer 13. According to this configuration, in the current conduction state of the IGBT, minority carriers injected from the p-type collector region 2 can be kept in the n-type drift layer 5a. Therefore, since the minority carrier concentration on the emitter side in the n-type drift layer 5a can be increased, the energization capacity of the IGBT can be improved.

According to the embodiments described above, in the method for manufacturing the semiconductor device, the n-type drift layer is prepared. Then, the p-type base region 6a is selectively formed in the surface layer in the region to be the IGBT of the drift layer, and the p-type anode region 6b is selectively formed in the surface layer in the region to be the FWD of the drift layer. Then, the n-type emitter region 7 is selectively formed in the surface layer of the p-type base region 6a. Then, the p-type collector region 2 is formed on the lower surface in the region to be the IGBT of the drift layer. Then, the high carrier lifetime region 12a having a carrier lifetime longer than that of the n-type drift layer 5a is formed at a position closer to the p-type collector region 2 than the p-type base region 6a in the region to be the IGBT of the drift layer. Then, the high carrier lifetime region 12b having a longer carrier lifetime than the n-type drift layer Sb is formed at a position closer to the p-type anode region 6b than the lower surface of the n-type drift layer 5b in the region to be the FWD of the drift layer. Then, the insulating film 10 in contact with the p-type base region 6a sandwiched between the n-type emitter region 7 and the n-type drift layer 5a is formed. Then, the gate electrode 9 in contact with the insulating film 10 is formed. Then, the emitter electrode 11 connected to the n-type emitter region 7 and the p-type anode region 6b is formed. Then, the collector electrode 1 connected to the p-type collector region 2 and the n-type drift layer 5b is formed.

According to this configuration, it is possible to improve energization capacity by increasing minority carrier injection efficiency, and to achieve reduction in turn-off loss and reduction in recovery loss.

It should be noted that unless otherwise limited, the order in which each piece of processing is performed can be changed.

In addition, even when at least one of the other configurations exemplified in the specification of the present application is appropriately added to the configurations described above, that is, even when other configurations exemplified in the specification of the present application not mentioned as the configurations described above are added, similar effects can be produced.

In addition, according to the embodiments described above, in order to form the high carrier lifetime region 12a, ions that induce interstitial carbon are implanted from the lower surface in the region to be the IGBT of the n-type drift layer, and furthermore, the interstitial carbon is thermally diffused into the n-type drift layer 5a. According to this configuration, the excess interstitial carbon-containing region 12 can be formed inside the n-type drift layer 5a (inner side of the pn junction portion).

In addition, according to the embodiments described above, in order to form the high carrier lifetime region 12b, ions that induce interstitial carbon are implanted from the upper surface in the region to be the FWD of the n-type drift layer, and furthermore, the interstitial carbon is thermally diffused into the n-type drift layer 5b. According to this configuration, the excess interstitial carbon-containing region 12 can be formed inside the n-type drift layer 5b (inner side of the pn junction portion).

In addition, according to the embodiments described above, the ion that induces interstitial carbon is carbon, silicon, hydrogen, or helium. According to this configuration, the excess interstitial carbon-containing region 12 can be formed inside the n-type drift layer 5a and inside the n-type drift layer 5b.

In addition, according to the embodiments described above, in order to form the high carrier lifetime region 12a, the lower surface in the region to be the IGBT of the n-type drift layer is thermally oxidized, and furthermore, excess interstitial carbon generated in the process of the thermal oxidation is diffused into the n-type drift layer 5a. According to this configuration, the high carrier lifetime region 12a can be formed inside the n-type drift layer 5a.

In addition, according to the embodiments described above, in order to form the high carrier lifetime region 12b, the upper surface in the region to be the FWD of the n-type drift layer is thermally oxidized, and furthermore, excess interstitial carbon generated in the process of the thermal oxidation is diffused into the n-type drift layer 5b. According to this configuration, the high carrier lifetime region 12b can be formed inside the n-type drift layer 5b.

<Modifications of Embodiments Described Above>

In the embodiments described above, quality of material, material, dimensions, shape, relative arrangement relationship, or condition of implementation of each component may be described, but these are one example in all aspects, and the present invention is assumed not to be limited to those described in the specification of the present application.

Therefore, innumerable modifications not exemplified and their equivalents are assumed within the scope of the techniques disclosed in the specification of the present application. For example, a case of deforming, adding, or omitting at least one component, and furthermore, a case of extracting at least one component in at least one embodiment to combine the extracted component with a component in another embodiment are assumed to be included.

In addition, it is assumed that as long as no contradiction arises, the components described as being provided with "one" component in the embodiments described above may be provided with "one or more" components.

Furthermore, each component in the embodiments described above is a conceptual unit, and the scope of the technology disclosed in the specification of the present application is assumed to include a case where one component includes a plurality of structures, a case where one component corresponds to part of a structure, and furthermore, a case where a plurality of components are included in one structure.

In addition, each component in the embodiments described above is assumed to include structures having other structures or shapes as long as the same function is exhibited.

In addition, the description in the specification of the present application is referred to for all purposes related to the present techniques, and none are assumed to be conventional techniques.

In addition, in the embodiments described above, when a material name or the like is described without particularly designated, as long as no contradiction occurs, the material is assumed to include a material that contains other additives, such as an alloy.

EXPLANATION OF REFERENCE SIGNS

0: n-type SiC support substrate
1: collector electrode
2: p-type collector region
3: n-type cathode region
5, 5a, 5b: n-type drift layer
6a, 60a: p-type base region
6b, 60b: p-type anode region
7, 70: n-type emitter region
8a, 80a: p-type base contact region
8b, 80b: p-type anode contact region
9, 90: gate electrode
10, 10A: insulating film
10B: gate insulating film
10C: interlayer insulating film
11, 110: emitter electrode
12: excess interstitial carbon-containing region
12a, 12b: high carrier lifetime region
13: n-type carrier accumulation layer
100, 200, 300, 400: SiC-RC-IGBT
1000: active region
1000A: IGBT region
1000B: FWD region
1001: termination region
2000: trench

The invention claimed is:

1. A semiconductor device comprising:
an IGBT; and
an FWD,
wherein the IGBT and the FWD are formed on an identical SiC semiconductor substrate, and the IGBT and the FWD are connected in antiparallel,
wherein the IGBT includes:
a first drift layer of a first conductivity type,
a collector region of a second conductivity type on a lower surface of the first drift layer,
a base region of a second conductivity type selectively formed in a surface layer of the first drift layer,
an emitter region of a first conductivity type selectively formed in a surface layer of the base region,
an insulating film in contact with the base region sandwiched between the emitter region and the first drift layer,
a gate electrode in contact with the insulating film, and
a first high carrier lifetime region formed at a position closer to the collector region than the base region in the first drift layer and having a longer carrier lifetime than the first drift layer, and
wherein the FWD includes:
a second drift layer of a first conductivity type,
a cathode region of a first conductivity type on a lower surface of the second drift layer,
an anode region of a second conductivity type selectively formed in a surface layer of the second drift layer, and
a second high carrier lifetime region formed at a position closer to the anode region than the cathode region in the second drift layer and having a longer carrier lifetime than the second drift layer,
the semiconductor device further comprising:
an emitter electrode connected to the emitter region and the anode region, and
a collector electrode connected to the collector region and the cathode region.

2. The semiconductor device according to claim 1, wherein a carrier lifetime of the first high carrier lifetime region is 10 times or more a carrier lifetime of the first drift layer.

3. The semiconductor device according to claim 1, wherein a carrier lifetime of the second high carrier lifetime region is 10 times or more a carrier lifetime of the second drift layer.

4. The semiconductor device according to claim 1, wherein a carrier lifetime of the first high carrier lifetime region is 3 µs or more and 50 µs or less, and a carrier lifetime of the first drift layer is 1 µs or less.

5. The semiconductor device according to claim 1, wherein a carrier lifetime of the second high carrier lifetime region is 3 µs or more and 50 µs or less, and a carrier lifetime of the second drift layer is 1 µs or less.

6. The semiconductor device according to claim 1, wherein the first high carrier lifetime region and the second high carrier lifetime region are separated from each other.

7. The semiconductor device according to claim 1,
wherein the IGBT further includes a carrier accumulation layer of a first conductivity type selectively formed in the surface layer of the first drift layer and having an impurity concentration higher than that of the first drift layer,
wherein the base region is selectively formed in a surface layer of the carrier accumulation layer, and
wherein the insulating film is in contact with the base region sandwiched between the emitter region and the carrier accumulation layer.

8. A method for manufacturing a semiconductor device in which an IGBT and an FWD are formed on an identical SiC semiconductor substrate, and the IGBT and the FWD are connected in antiparallel, the method comprising:
preparing a drift layer of a first conductivity type;
selectively forming a base region of a second conductivity type in a surface layer in a region to be the IGBT of the drift layer, and selectively forming an anode region of a second conductivity type in a surface layer in a region to be the FWD of the drift layer;
selectively forming an emitter region of a first conductivity type in a surface layer of the base region;
forming a collector region of a second conductivity type on a lower surface in a region to be the IGBT of the drift layer;
forming a cathode region of a first conductivity type on a lower surface in a region to be the FWD of the drift layer;
forming a first high carrier lifetime region having a longer carrier lifetime than the drift layer at a position closer to the collector region than the base region in a region to be the IGBT of the drift layer;
forming a second high carrier lifetime region having a longer carrier lifetime than the drift layer at a position closer to the anode region than the cathode region in a region to be the FWD of the drift layer;
forming an insulating film in contact with the base region sandwiched between the emitter region and the drift layer;
forming a gate electrode in contact with the insulating film;
forming an emitter electrode connected to the emitter region and the anode region; and
forming a collector electrode connected to the collector region and the cathode region.

9. The method for manufacturing a semiconductor device according to claim 8, further comprising, in order to form the first high carrier lifetime region, implanting ions that induce interstitial carbon from a lower surface in a region to be the IGBT of the drift layer, and further thermally diffusing the interstitial carbon into the drift layer.

10. The method for manufacturing a semiconductor device according to claim 8, further comprising, in order to form the second high carrier lifetime region, implanting ions that induce interstitial carbon from an upper surface in a region to be the FWD of the drift layer, and further thermally diffusing the interstitial carbon into the drift layer.

11. The method for manufacturing a semiconductor device according to claim 9, wherein the ion that induces the interstitial carbon is carbon, silicon, hydrogen, or helium.

12. The method for manufacturing a semiconductor device according to claim 8, further comprising, in order to form the first high carrier lifetime region, thermally oxidizing a lower surface in a region to be the IGBT of the drift layer, and further diffusing excess interstitial carbon generated in a process of the thermal oxidation into the drift layer.

13. The method for manufacturing a semiconductor device according to claim 8, further comprising, in order to form the second high carrier lifetime region, thermally oxidizing an upper surface in a region to be the FWD of the drift layer, and further diffusing excess interstitial carbon generated in a process of the thermal oxidation into the drift layer.

* * * * *